United States Patent [19]

Murabayashi et al.

[11] Patent Number: 5,539,686

[45] Date of Patent: Jul. 23, 1996

[54] CARRY PROPAGATING DEVICE

[75] Inventors: Fumio Murabayashi, Ibaraki-ken; Takashi Hotta, Hitachi; Masahiro Iwamura, Hitachi; Akiyoshi Osumi, Hitachi, all of Japan

[73] Assignee: Hitachi, Ltd., Tokyo, Japan

[21] Appl. No.: 315,591

[22] Filed: Sep. 30, 1994

Related U.S. Application Data

[63] Continuation of Ser. No. 860,442, Mar. 30, 1992, Pat. No. 5,363,332.

[30] Foreign Application Priority Data

Mar. 29, 1991 [JP] Japan ................................. 3-065999
Feb. 19, 1992 [JP] Japan ................................. 4-032211

[51] Int. Cl.⁶ ........................................................ G06F 7/50
[52] U.S. Cl. ........................................................ 364/787
[58] Field of Search ............................................. 364/787

[56] References Cited

U.S. PATENT DOCUMENTS

| | | | |
|---|---|---|---|
| 4,504,924 | 3/1985 | Cook et al. ............................ | 364/787 |
| 4,899,305 | 2/1990 | Needles ................................. | 364/787 |
| 4,962,471 | 10/1990 | Cornelissen .......................... | 364/787 |
| 5,140,546 | 8/1992 | Ishikawa et al. ..................... | 364/787 |
| 5,276,635 | 1/1994 | Naini et al. ........................... | 364/787 |

FOREIGN PATENT DOCUMENTS

| | | |
|---|---|---|
| 59-28726 | 2/1984 | Japan . |
| 61-20346 | 1/1986 | Japan . |
| 61-94529 | 8/1986 | Japan . |

OTHER PUBLICATIONS

N. Weste, et al., "Principles", Chapter 8 CMOS Subsystem Design, pp. 320–325.

*Primary Examiner*—David H. Malzahn
*Attorney, Agent, or Firm*—Antonelli, Terry, Stout & Kraus

[57] ABSTRACT

A carry propagating device, provided on a single substrate, is constituted by groups of first and second MOS transistors, a third MOS transistor, a bipolar transistor and first and second impedance elements. An output of the carry propagating device is provided at the collector of the bipolar transistor and is connected to a first power supply terminal through the first impedance element, the emitter is connected to a second power supply terminal through the second impedance element, and the base is connected to a fixed potential source. The first MOS transistors are connected in series between the emitter of the bipolar transistor and the second power supply terminal through the third MOS transistor controlled by a carry signal. As to the second MOS transistors, one is connected in parallel to the second impedance element and each of the remaining ones is connected between a common connection of a respective pair of adjacent ones of the series-connected first MOS transistors and the second power supply terminal. There is thus effected a speed-up of the carry signal and thereby a speeding-up of the signal processing. There is also provided a wiring scheme for preventing noise interference between different wirings. Moreover, a device has been schemed for a plurality of logic circuit blocks and including a data signal path for interconnecting different logic circuit blocks and facilitating the interfacing of a current-driven signal.

10 Claims, 25 Drawing Sheets

F I G. 1
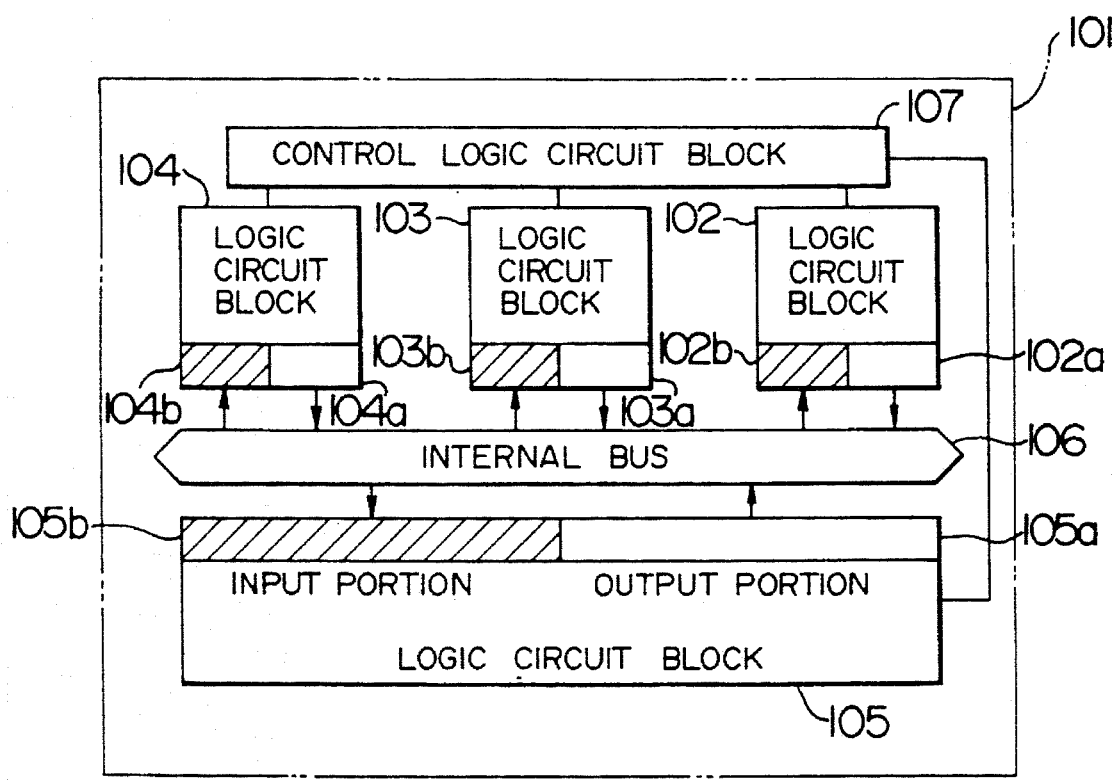

F I G. 12
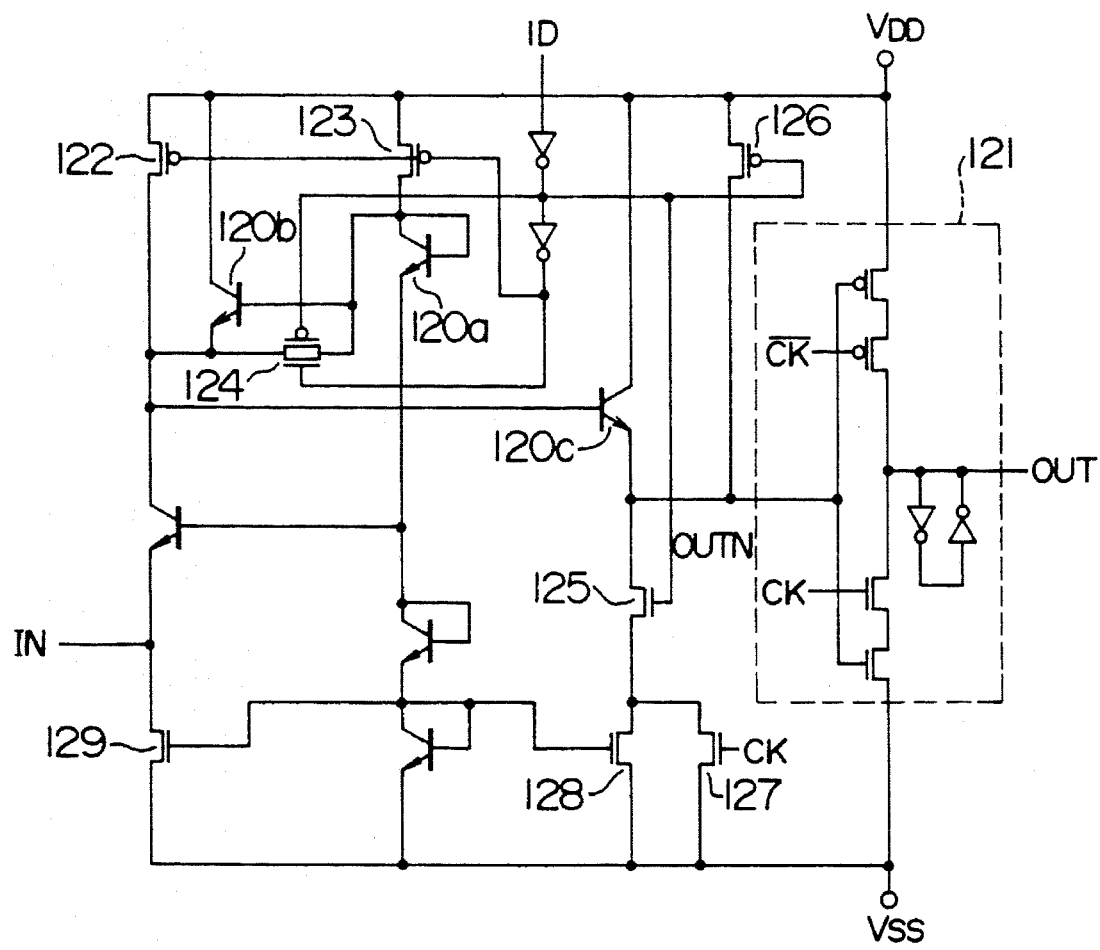

F I G. 22
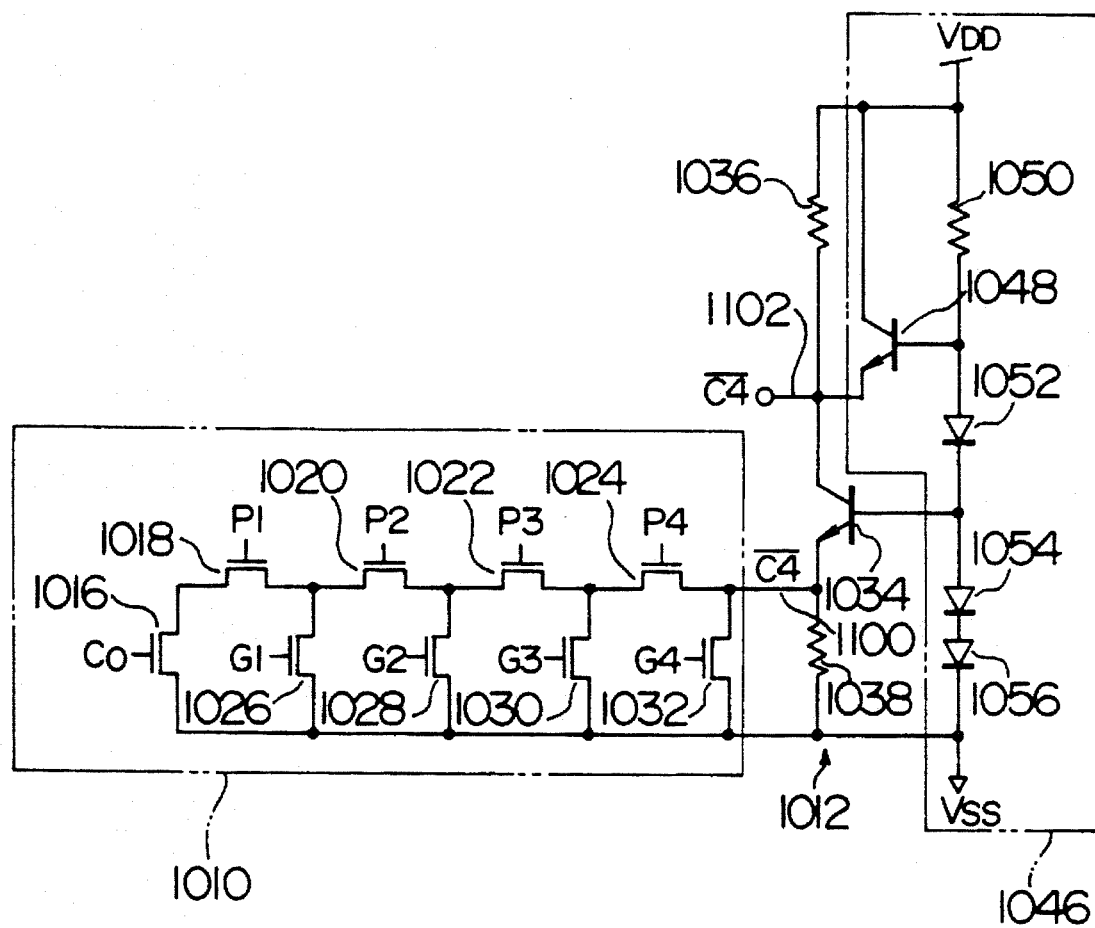

CARRY PROPAGATING DEVICE

This is a continuation of application Ser. No. 07/860,442, filed Mar. 30, 1992, now U.S. Pat. No. 5,363,332.

BACKGROUND OF THE INVENTION

The present invention relates to a semiconductor integrated circuit device having a plurality of MOS field-effect transistors and bipolar transistors and its applied circuit device, and more particularly to a hardware arrangement of a current-driven type signal interface for speeding up the signal interface and a carry propagation device having a hardware arrangement applied thereto.

As the hardware arrangement for speeding up a signal interface, which is comprised of a semiconductor integrated circuit device having a plurality of MOS field-effect transistors and bipolar transistors integrated thereon, a BiCMOS tri-state buffer circuit has been disclosed in JP-A-59-28726. The speed-up concept of this circuit is to amplify the current of the CMOS circuit through the effect of the bipolar transistors for enhancing the driving capability of a load and driving the load at a higher speed.

In addition, as an example, a current-driven circuit applied to a wiring driver and a receiver connecting for effecting interconnection of the LSI blocks has been disclosed in JP-A-61-20346.

The foregoing prior arts have the same signal amplitude as a voltage difference between a supply voltage and a grounding voltage, such as, used in a CMOS circuit. Since the signal amplitude is large, therefore, a large amount of charges to be charged or discharged is needed for inverting the signal. This puts a limitation to speeding up the circuit. Further, since the signal amplitude is large, the larger amount of current flows through the circuit within a unit time. This results in causing more noise.

The problems associated with the prior arts have will be described in detail with reference to FIGS. 19A to 19B. FIGS. 19A to 19B show a tri-state output buffer circuit and an input circuit used for the interface between logic blocks, respectively. In FIG. 19A, 201 is an input terminal. Numeral 202 is an enable terminal. When the voltage of the terminal 202 is at a high logical level "H", the output of the circuit has a high impedance. When it is at a low logical level "L", the circuit outputs an inversion signal of the input signal at the terminal 201. The output circuit has such a fundamental concept that the logic circuit is comprised of MOS transistors and the current is amplified with bipolar transistors for driving the heavy load depending on the wiring and fan-out at a high speed. The output circuit can supply a signal whose amplitude is substantially the same as that of the CMOS circuit, that is, the potential difference between a power supply potential 1 and a grounding potential 2. More strictly, the amplitude V of the output signal of such a circuit can be derived as V=VDD−GND−2Vbe, wherein VDD is a power supply potential, GND is a grounding potential, and Vbe is a potential between a base and an emitter of the bipolar transistors 203 and 204. As an example, VDD=5 V, GND=0 V and Vbe=0.7 V are referred. In this example, the amplitude of the output signal is V=3.6 V. That is, since the signal amplitude has such a high value as V=3.6, the foregoing problems may be brought about.

FIG. 20 shows a conventional BiCMOS I/O circuit. A BiCMOS output circuit 211, a CMOS output circuit 212 and a BiCMOS input circuit 213 are connected through a bus 214. When an input terminal 202 is at "L" and an input terminal 215 is at "L", the BiCMOS output circuit 211 is selected so that the output of the CMOS output circuit 212 has a high impedance. At this condition, the bus 214 is at 0 V or 3.6 V depending on the state of the input terminal 201. When the input terminal 202 is at "H" and the input terminal 215 is at "H", the CMOS output circuit 212 is selected so that the output of the BiCMOS output circuit 211 has a high impedance. In this condition, the bus is at 0 V or 5 V depending on the state of the input terminal 216. As mentioned above, the conventional circuit provides such a high signal amplitude of the bus as 5 V or 3.6 V.

The conventional data processing apparatus employs a semiconductor element with a high-speed operating capability. This is not fast enough to process a signal at high speed. The main factor greatly controlling the performance of such a data processing apparatus is a carry delay in an adder. As a word length of the input data is made longer, the carry delay of the adder is increased linearly. To improve such a delay, a proposal has been made that a carry of each stage is calculated in parallel. Such an improved method, which is well known, is described in "Principles of CMOS VLSI Design: A Systems Perspective", by Neil H. E. Weste and Kamran Eshraghian, published 1985.

In the writing, an i-th carry Ci is represented by the following expression.

$$Ci = Gi + Pi \cdot Ci{-}1 \quad (1)$$

wherein $$Gi = Ai \cdot Bi \text{ (Generation Signal)} \quad (2)$$

$$Pi = Ai \oplus Bi \text{ (Propagation Signal)} \quad (3)$$

The expansion of those expressions results in obtaining the following expression.

$$Ci = Gi + Pi \cdot Gi{-}1 + Pi \cdot Pi{-}1 \cdot Gi{-}2 + \ldots + Pi \cdot Pi{-}1 \ldots P1 \cdot C0 \quad (4)$$

The sum Si can be generated by the following expression.

$$\begin{aligned} Si &= Ci{-}1 \oplus Ai \oplus Bi \\ &= Ci{-}1 \oplus Pi(Pi = Ai \oplus Bi) \end{aligned} \quad (5)$$

For the first four gates, the terms indicated below can be obtained.

$$C_1 = G_1 + P_1 C_0 \quad (6)$$

$$C_2 = G_2 + P_2 G_1 + P_2 P_1 C_0 \quad (7)$$

$$C_3 = G_3 + P_3 G_2 + P_3 P_2 G_{11} + P_3 P_2 P_1 C_0 \quad (8)$$

$$C_4 = G_4 + P_4 G_3 + P_4 P_3 G_2 + P_4 P_3 P_2 C_1 + P_4 P_3 P_2 P_1 C_0 \quad (9)$$

With respect to $C_4$, the expression of $C_4$ can be represented by the following expression.

$$C_4 = G_4 \cdot P_4 \cdot (G_3 + P_3 \cdot (G_2 + P_2 \cdot (G_1 + P_1 \cdot C_0))) \quad (10)$$

As one example of a circuit for realizing the foregoing operational expression, a Manchester carry adder shown in FIG. 27 has been known. This adder is arranged as a Manchester carry propagating circuit composed of MOS transistors only. When each MOS transistor operates on a clock signal, the transistor at an output stage changes between 0 V and 5 V. That is, the amplitude of the propagation signal is so large as to restrict the speed-up of the signal processing. Further, in this circuit, when the clock signal CK is at a logic "0", the node is pre-charged so that the output C4 is fixed at a logic "0". When the clock signal CK is at a logic "1", depending on the logic condition, the charges are discharged from the node for defining the output C4. This means that the signal is allowed to be propagated only when the clock signal CK remains at "1".

To improve this disadvantage, as described in JP-A-61-194529, there has been proposed a carry propagating device arranged to have bipolar transistors and CMOS transistors in combination. As shown in FIG. 28, this device is arranged to have a Manchester carry propagating circuit composed of the MOS transistors only and a sensing circuit composed of a bipolar transistor. The output signal of the Manchester carry propagating circuit is applied to between a base and an emitter of the bipolar transistor. Hence, the carry signal is allowed to be transmitted in the range of 0.8 V. This makes it possible to reduce the amplitude of the carry signal for speeding up the signal processing.

The prior arts, however, are designed so that the transistors may operate on a clock signal. Hence, these prior arts need a half cycle for pre-charging a node and a half cycle for determining a logic, so that the propagating period of the signal is limited to a half cycle of the clock signal. Besides, the amplitude of the carry signal cannot be limited to 0.8 V or less.

SUMMARY OF THE INVENTION

It is an object of the present invention to provide a current-driven signal interface implemented by a semiconductor integrated circuit device operated at a high speed and in the state of low noise.

It is another object of the present invention to provide a carry propagating device, a register file device and a semiconductor integrated circuit device which are capable of propagating a signal without needing use of a clock signal.

The foregoing objects can be achieved by the current-driven signal interface which has a far smaller signal amplitude requirement of a bus. According to one feature of the present invention, a current-driven path is connected between the logic circuit blocks each comprised of at least MOS field-effect transistors. Herein, the term "current-driven path" means a path through which an input/output (I/O) of a signal is transmitted by controlling the flow of the current.

To describe the feature of this invention in more detail, an input unit of the logic circuit block connected to the current-driven path has a bipolar transistor whose emitter is connected to a constant current source. An output unit of the block has a switching element for controlling the current. The propagation or transmission of the signal is carried out by controlling the current flowing from the emitter of the bipolar transistor through the path with the switching element.

FIG. 2 shows a fundamental implementation of a small-amplitude signal interface according to the concept of the invention. A numeral 200 denotes an input portion of the logic circuit block and 201 denotes an output portion of the logic circuit block. These input and output portions are connected through a signal line 207 (data signal path) so that the output portion 201 may send data to the input portion 200. The input portion 200 is composed of a bipolar transistor 202, an impedance element 203 and a constant current source 204. The base of the bipolar transistor 202 is connected to a fixed potential VB and the collector of the transistor 202 is connected to a power supply VCC through an impedance element 203. The power supply VCC is a first potential unit. The emitter of the transistor 202 is connected to a constant current source 204 and to a small-amplitude signal line 207. The constant current source 204 may be an impedance element. The output portion 201 is comprised of a switching element 205 and an element 206 for controlling the element 205.

How the circuit arrangement can implement the small-amplitude signal interface will be described below. At first, the constant current source 204 of the input portion 200 constantly flows the current I1. When, therefore, the switch 205 of the output portion 201 is turned off, no current flows through the signal line 207. The current of I1 is allowed to flow through the emitter of the bipolar transistor 202 contained in the input portion 200. Assuming that a forward voltage between the base and the emitter of the bipolar transistor 202 is VBE1, VBE1 can be represented by the following expression.

$$VBE1 = (KT/q) \ln (I1/Is) \qquad (11)$$

wherein q is a charge amount of electrons, K is a Boltzmann's constant, T is an absolute temperature, and Is is a saturated current. Then, when the switch 205 of the output portion 201 remains on, the current of I2 is allowed to flow through the signal line 207. If the current I2 is set to be far larger than the current I1, the current of I2 is allowed to flow through the emitter of the bipolar transistor 202 contained in the input portion 200 in an approximating manner to the signal line 207. Assuming that the forward voltage between the base and the emitter of the bipolar transistor 202 is VBE2, the voltage of VBE2 is represented by the following expression (12).

$$VBE1 = (KT/q) \ln (I2/Is) \qquad (12)$$

Since the fixed potential VB is applied to the base of the bipolar transistor 202 included in the input portion 200, the signal amplitude ΔV of the signal line 207 can be represented by the following expression (13)

$$\begin{aligned} \Delta V &= (VB - VBE1) - (VB - VBE2) \\ &= VBE1 - VBE2 \\ &= (KT/q)\ln(I2/Is) - (KT/q)\ln(I1/Is) \\ &= (KT/q)\ln(I2/I1) \end{aligned} \qquad (13)$$

Assume that I2=0.5 mA and I1=20 μA as an example. Since KT/q is 20 mV in a room temperature, the amplitude of the signal line 207 is ΔV=84 mV. According to the circuit arrangement, the signal amplitude used for the interfacing operation is reduced to a level of several tenths as compared with the prior art. It will be understood from the above expression that the amplitude ΔV of the signal line 207 is determined on a ratio of the current I1 flowing through the constant current source of the input portion and the current I2 flowing through the switch of the output portion.

In general, assuming that the output current of the circuit is I, the load capacitance of an output is C and a signal amplitude is V, the delay time T of the circuit is approximately represented as T=CV/I. As is obvious from this expression, the delay time T of the circuit is made smaller in proportion to the signal amplitude V. The important factor is that the far smaller signal amplitude V makes the high-speed signal propagation possible if the output current I of the circuit is set as a small value. This means that a small circuit makes the high-speed signal interface possible.

Assuming that the inductance of the signal line is L and the output current of the circuit is I, the noise Vn is represented as Vn=LdI/dt, which means that the noise Vn is proportional to the current amount flowing at a unit time. If the signal amplitude is made far smaller, the output current I of the circuit is made smaller. Hence, the noise appearing in the circuit is made smaller.

The carry propagating device according to a preferred aspect of the invention includes a first group of switching elements to be controlled on the basis of the logic states of two or more digital signals, a second group of switching elements to be controlled on the basis of the logic states of two or more digital signals, a third group of switching elements for responding to a carry signal, a bipolar transistor, and first and second impedance elements. The collector of the bipolar transistor is connected as an output terminal to a first power supply through the first impedance element. The emitter of the bipolar transistor is connected to a second power supply through the second impedance element. The base of the bipolar transistor is connected to the fixed potential. The first switching elements are connected in series in a manner that one terminal of each of the first switching elements is connected to the emitter of the bipolar transistor and the other terminal is connected to a second power supply through each of the third switching elements. The second switching elements are arranged so that one switching element is connected in parallel to the second impedance element and the remaining switching elements are connected to each series contact of the first switching elements and the second power supply.

In the carry propagating device formed on a semiconductor substrate, the signal lines for digital transmission are divided into two groups on the basis of the magnitude of each voltage amplitude and each group of signal lines is wired on the corresponding wiring layer, the wiring layer for the smaller voltage-amplitude group is inserted between a pair of wiring layers having a power supply line wired to each layer. The wiring layer for the larger voltage-amplitude group is laminated on the power-supply-line wiring layer with this wiring layer being located between the wiring layers for the larger voltage-amplitude group and for the smaller voltage-amplitude group.

The register file device to which the principle of the invention is applied includes a first group of switching elements to be controlled on the basis of a control signal, a plurality of memory cells storing data, a second group of switching elements to be controlled on the data stored in each of the memory cells, a bipolar transistor, and first and second impedance elements. The collector of the bipolar transistor is connected as an output terminal to a first power source through the first impedance element. The emitter of the bipolar transistor is connected to a second power supply through the second impedance element. The base of the bipolar transistor is connected to a fixed potential. Each of the first switching elements is paired with a respective one of the second switching elements. Each pair of first and second switching elements are connected in series. One end of each pair is connected to the emitter of the bipolar transistor and the other end of each pair is connected to the second power supply.

To roughly describe the operation of the carry propagating device, the collector of the bipolar transistor connected to the MOS transistors constituting a logic circuit for carry propagation is connected to the first power supply through the first impedance element. The emitter of the bipolar transistor is connected to the second power supply through the second impedance element. The fixed potential is applied to the base of the bipolar transistor. If the carry signal is generated from the logic circuit for carry propagation, the bipolar transistor keeps the potential of the collector at high level, because the current passage routing to the emitter, the MOS transistors of the logic circuit and the second power source is screened. If the carry signal is generated by the logic operation of the logic circuit for carry propagation, the current flows from the emitter to the second power source through each MOS transistor, serving as a current passage, contained in the logic circuit. The potential of the collector of the bipolar transistor is changed from the high level to the low level. The sensing circuit operates in a completely static manner. The logic circuit for carry propagation is arranged to have a group of first MOS transistors to be controlled according to an exclusive OR of the digital signals, a group of second MOS transistors to be controlled according to an AND of the digital signals, and a third MOS transistor for responding to a carry signal. The carry signal is allowed to be output only by the logic operation performed by the MOS transistors. That is, the carry signal can be propagated without having to use the clock signal. Further, the amplitude of the carry signal is restricted by the voltage of the emitter of the bipolar transistor. Hence, the generated carry signal has such a low amplitude as about 0.1 V. This may make contribution to speeding up the signal processing.

In the register file device, the MOS transistors connected to the emitter of the bipolar transistor is controlled according to a readout control signal or the data stored in the memory cells. Hence, the data transmission can be carried out without having to use the clock signal. The amplitude of the data signal stored in each of the memory cells is limited by the emitter voltage of the bipolar transistor. This makes it possible to reduce the amplitude of the signal, thereby making contribution to speeding up the data transmission speed.

BRIEF DESCRIPTION OF THE DRAWINGS

FIG. 1 is a block diagram schematically showing a semiconductor integrated circuit device according to the present invention;

FIG. 12 is a circuit diagram showing an input circuit according to another embodiment of the present invention;

FIG. 22 is a circuit diagram showing a modification of the device shown in FIG. 21;

DESCRIPTION OF THE PREFERRED EMBODIMENTS

Figure 2:
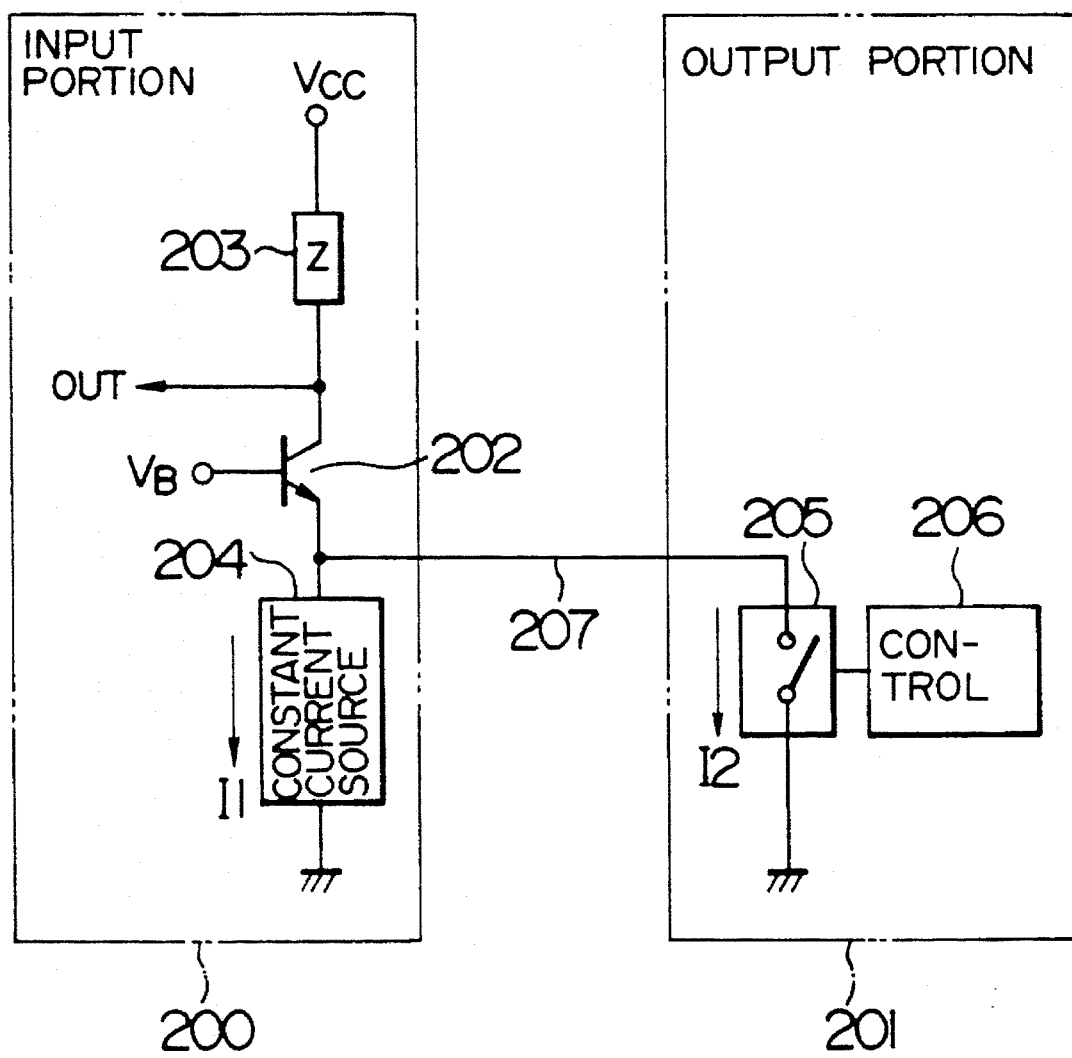
FIG. 2 is a circuit diagram for explaining a fundamental concept of an I/O circuit according to the present invention.
Figure 3:
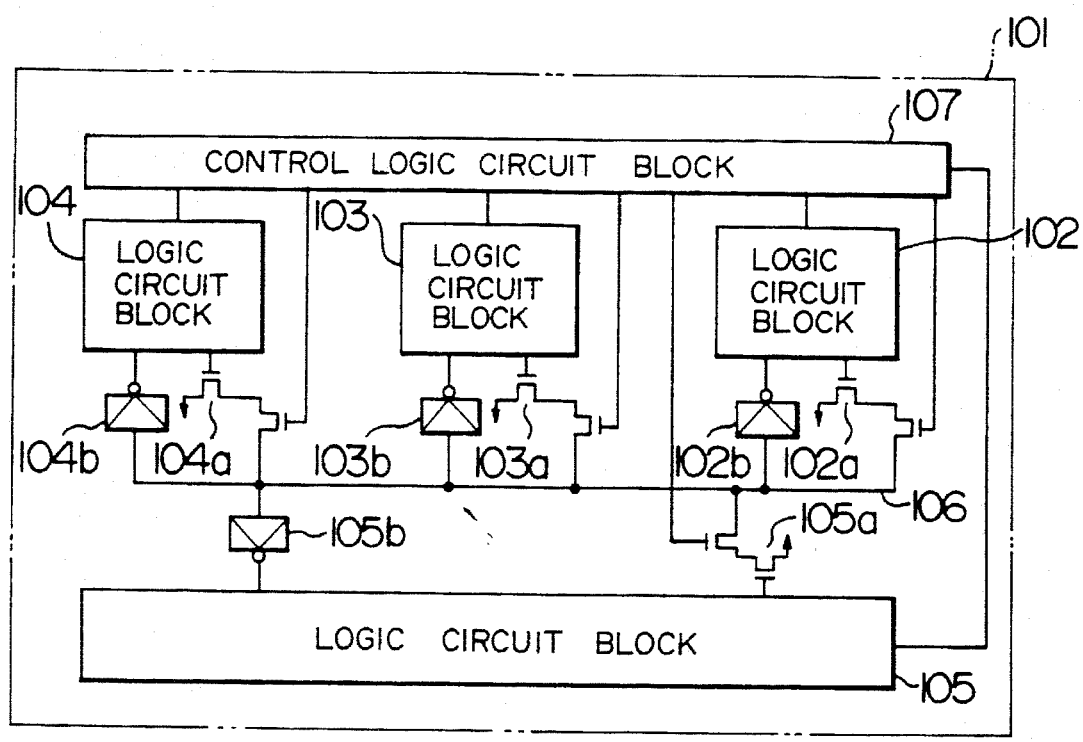
FIG. 3 is a block diagram showing a semiconductor integrated circuit device embodying the device of FIG. 1.
Figure 4A:
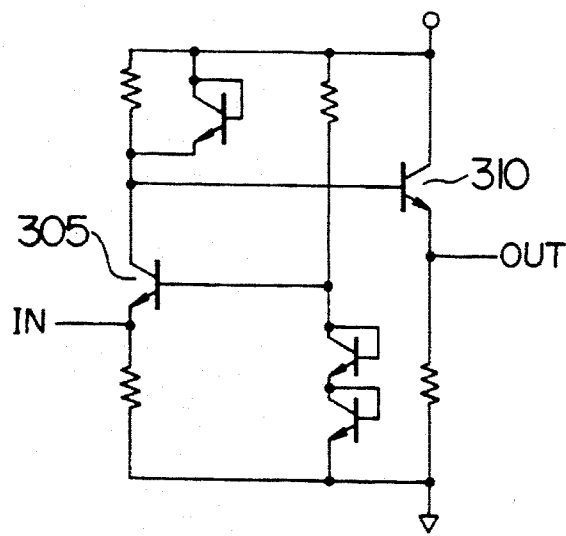
FIG. 4A is a circuit diagram showing an input circuit according to an embodiment of the present invention.
Figure 4B:
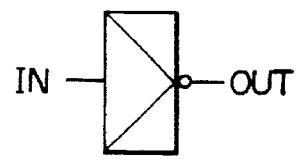
FIG. 4B is a view showing a symbol of an I/O circuit of the present invention.
Figure 5:
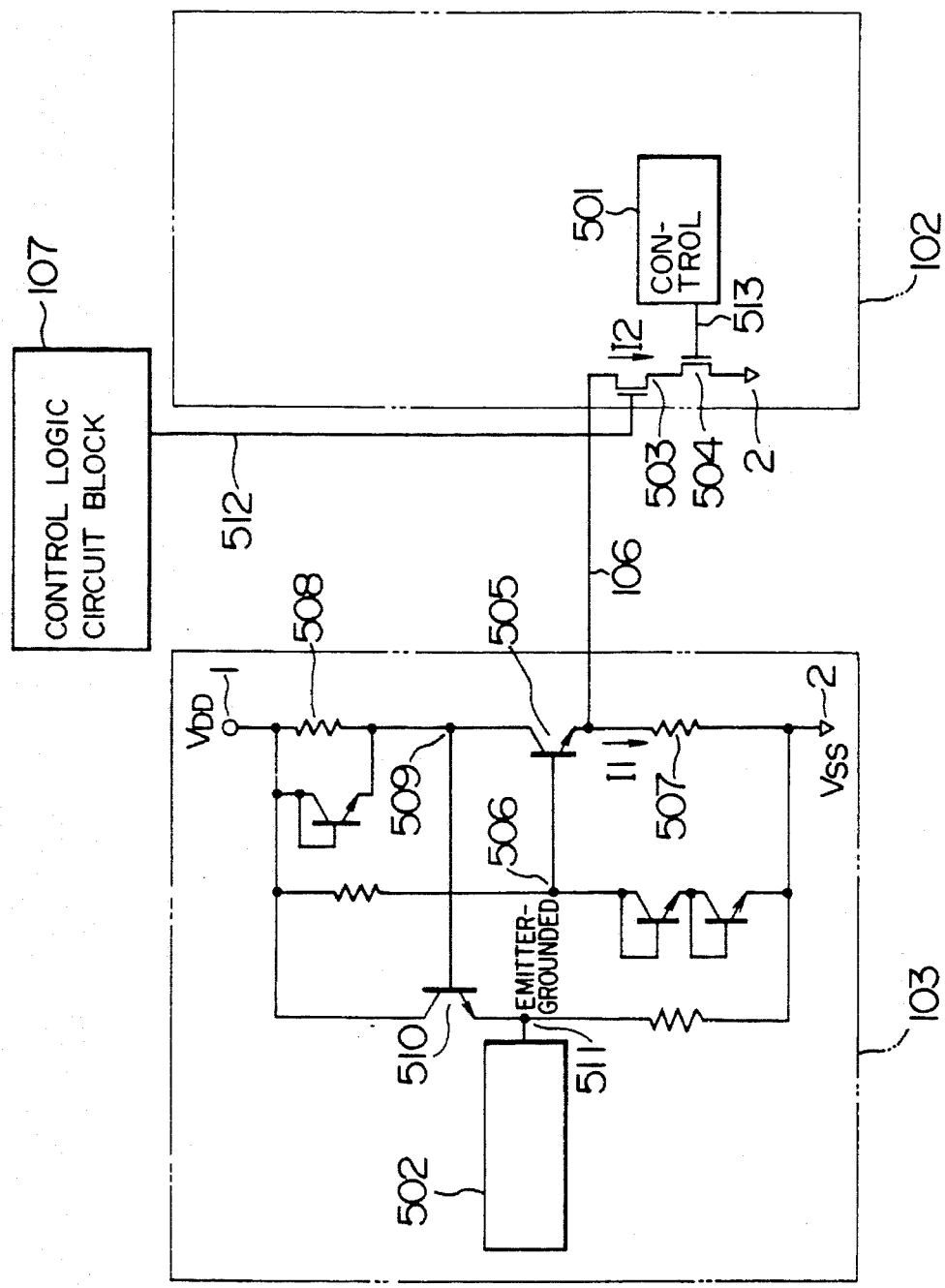
FIG. 5 is a circuit diagram showing an embodiment to which the invention is applied between logic circuit blocks.

Next, an embodiment of the present invention will be described in detail. FIG. 1 is a semiconductor integrated circuit device according to an embodiment of the present invention. The device 101 includes a plurality of logic circuit blocks 102, 103, 104, 105 built therein. Those logic circuit blocks are connected to one another through an internal bus 106. 107 is a control logic circuit block for controlling the logic circuit blocks 102 to 105. 102a, 103a, 104a and 105a each denote an output unit of a signal contained in each logic circuit block. 102b, 103b, 104b and 105b each denote an input unit of a signal included in each logic block. Each of the output units 102a to 105a is composed of MOS transistors only. Each of the input units 102b to 105b has a bipolar transistor as a main component. As stated above, the fundamental concept of the prior art is that the current of the input unit comprised of the MOS transistors is amplified by the bipolar transistor of the output unit. On the other hand, the present invention uses the MOS transistors and the bipolar transistor in an inversion manner. FIG. 3 shows the detailed form of the arrangement shown in FIG. 1. The same reference numbers as those shown in FIG. 1 indicate the same parts. In FIG. 3, each of symbols 102b to 105b are expanded in FIG. 4B. The detailed circuit of the symbol is shown in FIG. 4A. In the embodiment shown in FIG. 3, a signal is output from the NMOS transistors 102a to 105a output and is input to a circuit comprised of the bipolar transistor as shown by 102b to 105b for the purpose of executing the interfacing between the blocks. The operation principle of this embodiment will be described with reference to FIG. 5. The arrangement of the circuit will be described in detail. FIG. 5 is a circuit diagram for explaining how a signal is sent from the logic circuit blocks 102 to 103 shown in FIG. 3. The same symbols as those shown in FIG. 3 indicate the same components. The output circuit of the logic circuit block 102 is composed of NMOS's 503 and 504. The gate of the NMOS 503 is controlled by another logic circuit block 107 and the drain of the NMOS 503 serves as an output terminal and is connected to a bus 106.

The NMOS 503 is connected in series with the NMOS 504 and the source of the NMOS 504 is connected to a grounding potential terminal 2 which is the second electronic potential portion. The gate of the NMOS 504 is connected to an internal logic circuit block 501 contained in the logic circuit block 102 so as to receive an output signal to be sent to the external logic circuit block 103. In the logic circuit block 103, on the other hand, the bipolar transistor 505 senses a minute signal flowing through the bus 106 and sends a signal to the internal logic circuit block 502. The emitter of the bipolar transistor 505 is connected as an input terminal to the bus 106. The base of the transistor 505 is connected to a fixed potential terminal 506. The emitter and a resistor 507 are connected in series to the grounding potential terminal 2. The collector and a resistor 508 are connected in series to a power supply potential terminal 1, which is a first potential portion. The signal amplified by the bipolar transistor 505 is sent to the internal logic circuit block 502 contained in the logic circuit block 103 through the effect of an emitter follower 510. Next, the operation of the circuit will be described. When the control signal from the logic circuit block 107 is at a low-level logic "L", that is, a signal line 512 is at "L", the NMOS 503 is switched off, so that the output terminal is in the high-impedance state. Next, when the control signal from the logic circuit block 107 is at a high-level logic "H", that is, the signal line is at "H", the NMOS 503 is switched on, so that the output circuit 504 of the logic circuit block is ready for transmission. When a signal 513 from the internal logic circuit block 501 is at "H", the current I2 flows through the NMOS 504. On the other hand the d.c. current I1 constantly flows through the emitter of the bipolar transistor 505 contained in the input circuit of the logic circuit block 103. Hence, the emitter current flowing through the bipolar transistor 505 becomes a sum of I1 and I2. Assuming that the base current of 505 is Ib, the collector current Ic of 505 is derived as Ic=I1+I2−Ib. Since I1 and Ib are normally set to be far smaller than I2, the approximation of Ic=I2 is made possible. Thus, the voltage VIL of the collector 509 of the bipolar transistor 505 is VIL=VDD−I2·R1, wherein the power supply potential 1 is VDD and the resistor 508 is R1. Assuming that the voltage between the base and the emitter of the bipolar transistor 510 is Vbe, the voltage Va of the output terminal 511 of the input circuit is derived as VOL=VDD−I2·R1−Vbe. Conversely, when the signal 513 from the internal logic circuit block 501 is at "L", the NMOS 504 is switched off so that no current flows through the NMOS 504. Though the d.c. current I1 flows through the emitter of the bipolar transistor 505 contained in the input circuit of the logic circuit block 103, the bipolar transistor 505 is approximately regarded as an off state, because I1 is far smaller than I2. Hence, the voltage VOH at the output terminal 511 is VOH=VDD–Vbe. The signal amplitude Vbus of the bus, which is the most significant value in this invention, can be represented as follows by using the currents I1 and I2.

$$Vbus = (kT/q) \ln (I2/I1) \tag{14}$$

where q is a charge amount of electrons, k is a Boltzmann's constant and T is a temperature. The concrete values will be illustrated as follows. I1=20 µA, I2=0.5 mA, R1=3.3 kΩ, and VDD=3.3 V. Those values are substituted into the above-mentioned expressions. The result is that VOL=0.85 V, VOH=2.5 V, and Vbus=84 mV. The following description will be directed to checking whether or not these values can solve the problem of the prior art. As described above, the problem of the prior art is that a larger signal amplitude greatly limits the speed-up of the device. The prior art indicate the signal amplitude of 3.6 V, while the circuit according to the invention indicates the amplitude of 84 mV, which is reduced to about 1/40. Obviously, the charge amount required to reverse (or invert) the logic signal level is made smaller, resulting in greatly speeding up the propagation of the signal according to the expression (14). In addition, since the signal amplitude is small, the spontaneous current appearing in the output circuit is made smaller, resulting in reducing the noises generated in the output circuit.

Figure 6:
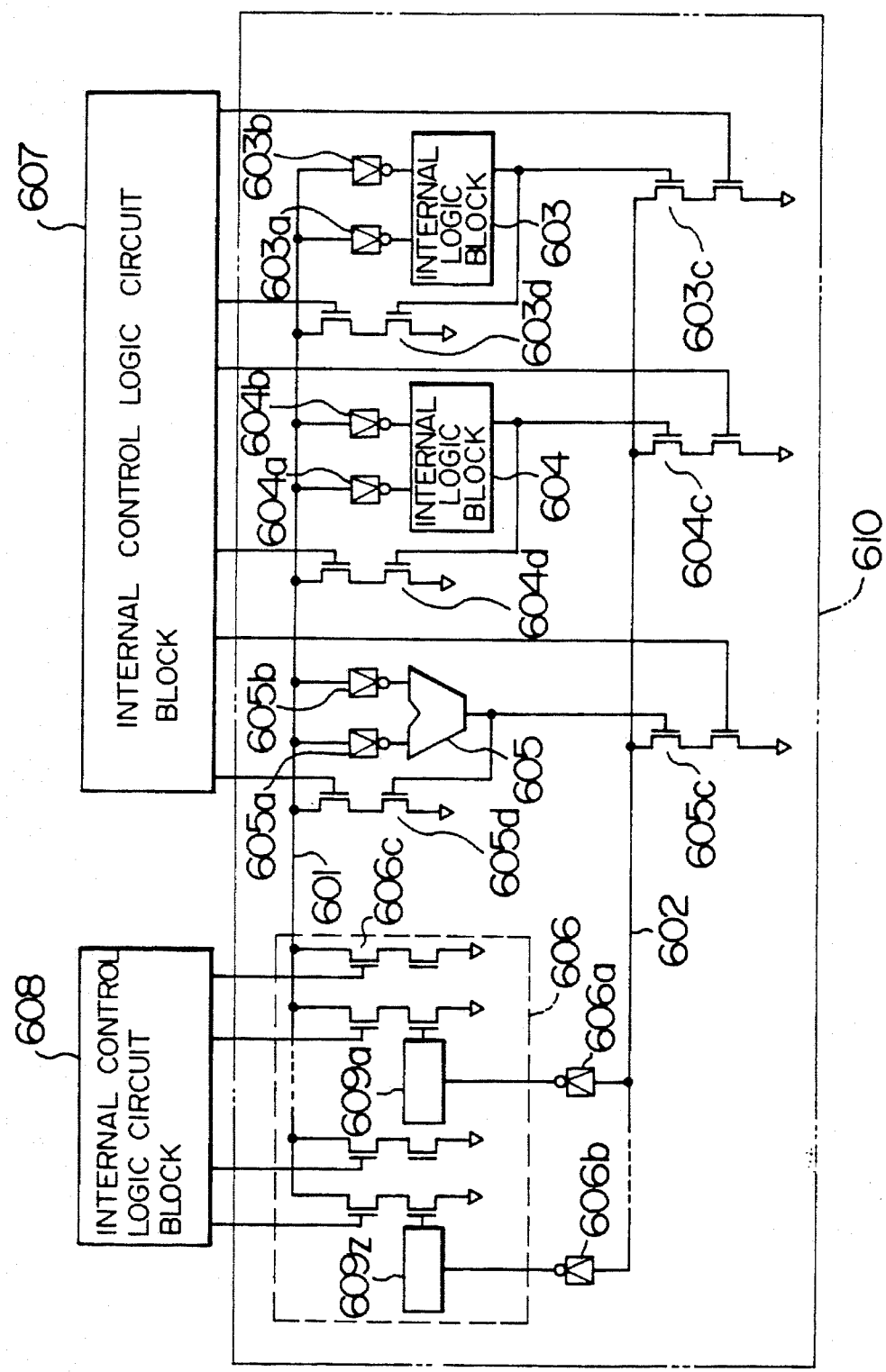
FIG. 6 is a circuit diagram showing an embodiment to which the invention is applied in a logic circuit block.

FIG. 6 shows the circuit in which the present invention is applied to an internal bus of a logic circuit block 610. The block 610 corresponds to one of the logic circuit blocks 102 to 105 shown in FIG. 1. The overall arrangement will be described. Numerals 601 and 602 denote low amplitude-signal transfer buses designed according to the concept of the present invention. A numeral 601 denotes a source bus through which data is read from a register file and which data is read into each logic circuit block. A numeral 602 denotes a target bus through which an output result from each logic circuit block is written into a register file. According to this embodiment, the source bus 601 has two ports and the target bus 602 has one port. Numerals 603, 604 and 605 denote internal logic circuit blocks which, respectively, correspond to a multiplier, a divider, and an adder. A numeral 606 denotes a register file. Numerals 609*a* to 609*z* denote memory cells of a RAM or a ROM. Each memory cell has a MOS field-effect transistor as a minimum component. The register file is arranged to have three ports, that is, one write port and two read ports. Though this embodiment has a three-port arrangement for making the explanation easier, the register file may have another arrangement of seven ports, that is, four read ports and three write ports. Numerals 603*a* to 606*a* and 603*b* to 606*b* denote input portions shown in FIG. 4B. Numerals 603*c* to 606*c* and 603*d* to 605*d* denote output portions as shown in FIG. 5. 607 is an internal control logic circuit block for controlling the output portions 603*d* to 605*d* and 603*c* to 605*c*. A numeral 608 denotes an internal control logic circuit block for controlling the register file. The principle of the operation is the same as that of the foregoing embodiment. Also in this embodiment, the output portion is composed of an NMOS transistor and the input portion is composed of a bipolar transistor. The signal amplitudes of the buses 601 and 602 are as small as about 100 mV. This makes it possible to speed up the bus and suppress the noise. Another advantage of this embodiment is that the bypass to the bus 601 can be easily implemented by the output portions 603*d* to 605*d*. The bypass means directly sending the operational results of the internal logic circuit blocks 603, 604, 605 to the source bus 601 without passing through the register file. The bypass is used when the operational result of each internal logic circuit block 603, 604 or 605 is immediately used for the next operation. When the bypass is used, the control logic circuit block 607 serves to generate a control signal for selecting one of the bypass circuits 603*d* to 604*d*. Through the selected bypass circuit, the operational result of the selected internal logic circuit block is bypassed to the bus 601. In this embodiment, therefore, the bypass circuit can be quite easily composed. That is, the two NMOS transistors connected in series can compose the bypass circuit. This embodiment can offer the following advantages as compared to the prior art.

First, the processing speed is made higher and the noise is made lower, because the signal amplitude is quite small.

Second, the switching of the output circuit for bypass is quite rapid, because the bypass circuit is comprised of only two NMOS transistors.

Third, since the amplitude of the signal to be transferred is small, the output circuit needs to output quite a small current. Hence, the transistor does not need to be larger in size and the output capacitance of the output circuit can be smaller. In general, since numerous pieces of data need to be bypassed, a lot of output circuits for bypassing are connected to the bus 601 so that the capacitance of the bus 601 is defined greatly depending on the output capacitance of the output circuit for bypass. That is, based on the concept of this invention which can reduce the output capacitance of the output circuit for bypass, the capacitance of the bus can be made smaller, resulting in being able to drive the bus at high speed.

As described above, FIG. 3 shows the embodiment wherein the present invention is applied to the interface between the logic circuit blocks. FIG. 6 shows the embodiment wherein the present invention is applied to an internal bus of the logic circuit block. Now, FIG. 9 shows an embodiment wherein the present invention is applied to a microprocessor.

Figure 9:
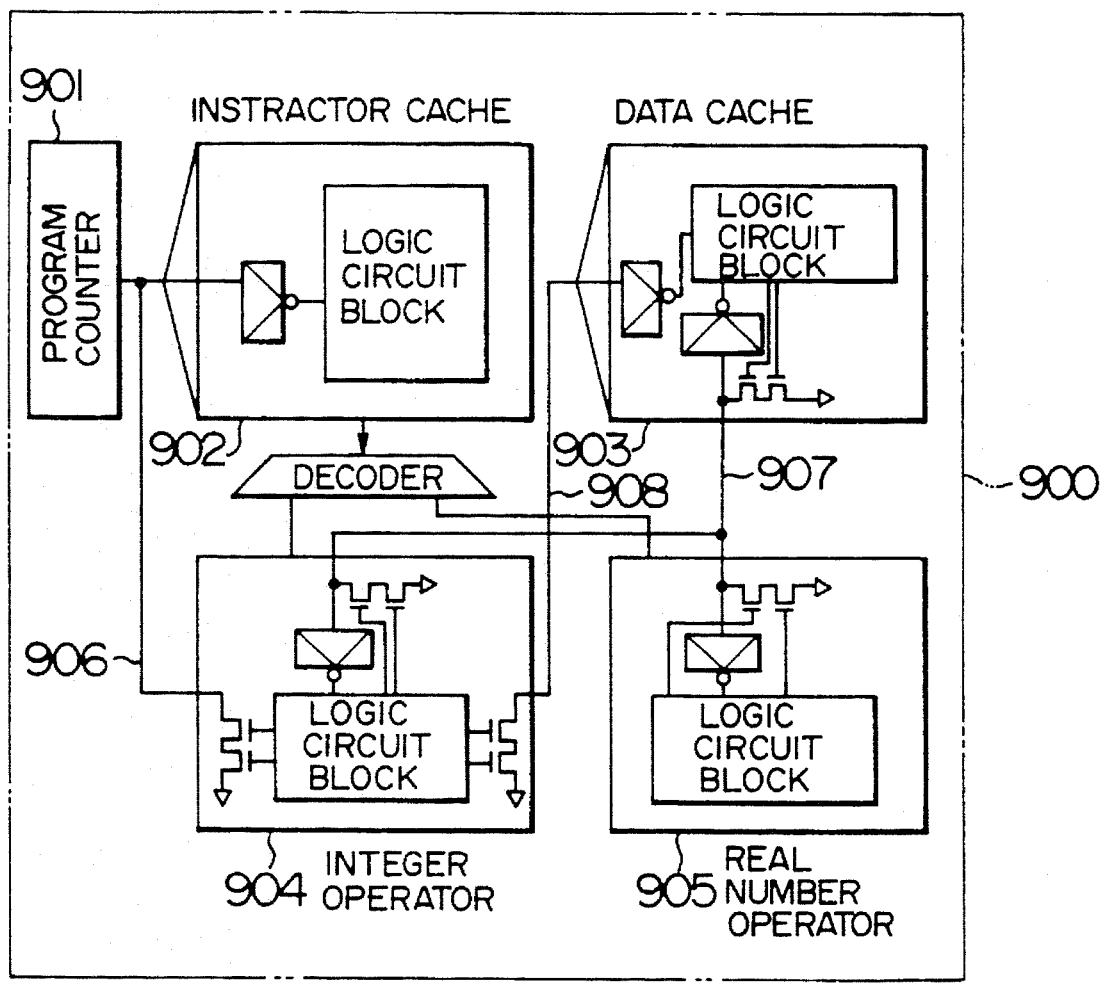
FIG. 9 is a block diagram showing a microprocessor according to an embodiment of the present invention.

In FIG. 9, a numeral 900 denotes a one-chip microprocessor, which is arranged to have a program counter 901, an instruction cache 902, a data cache 903, an integer operator 904, a real number operator 905, and the other control logic circuits. The program counter 901, the instruction cache 902 and the integer operator 904 are connected through a data bus 906. The data cache 903 and the integer operator 904 are connected through a data bus 908. Through the data bus 906, the program counter 901 or the integer operator 904 specifies an address of the instruction cache 902. Through the data bus 907, the data is sent from the data cache 903 to the integer operator 904 and the real number operator 905. Through the data bus 908, the integer operator 904 specifies an address of the data cache 903. These data buses 906, 907, 908 have common characteristics of a large load capacitance and of being critical paths for controlling the performance of the processor. Hence, it is quite effective if the concept of this invention is applied to these data buses. As shown in FIG. 9, the data buses 906, 907 and 908 are connected to the I/O circuit according to the concept of the present invention. This connection makes it possible to implement the interfacing of a small-amplitude signal bus, resulting in being able to drive the one-chip microprocessor at higher speed. The above description has been concerned with the one-chip microprocessor. Without being limited to it, the concept of this invention may apply to an interface between chips on a multi-chip module or an interface between blocks on a wafer scale integration.

Figure 7:
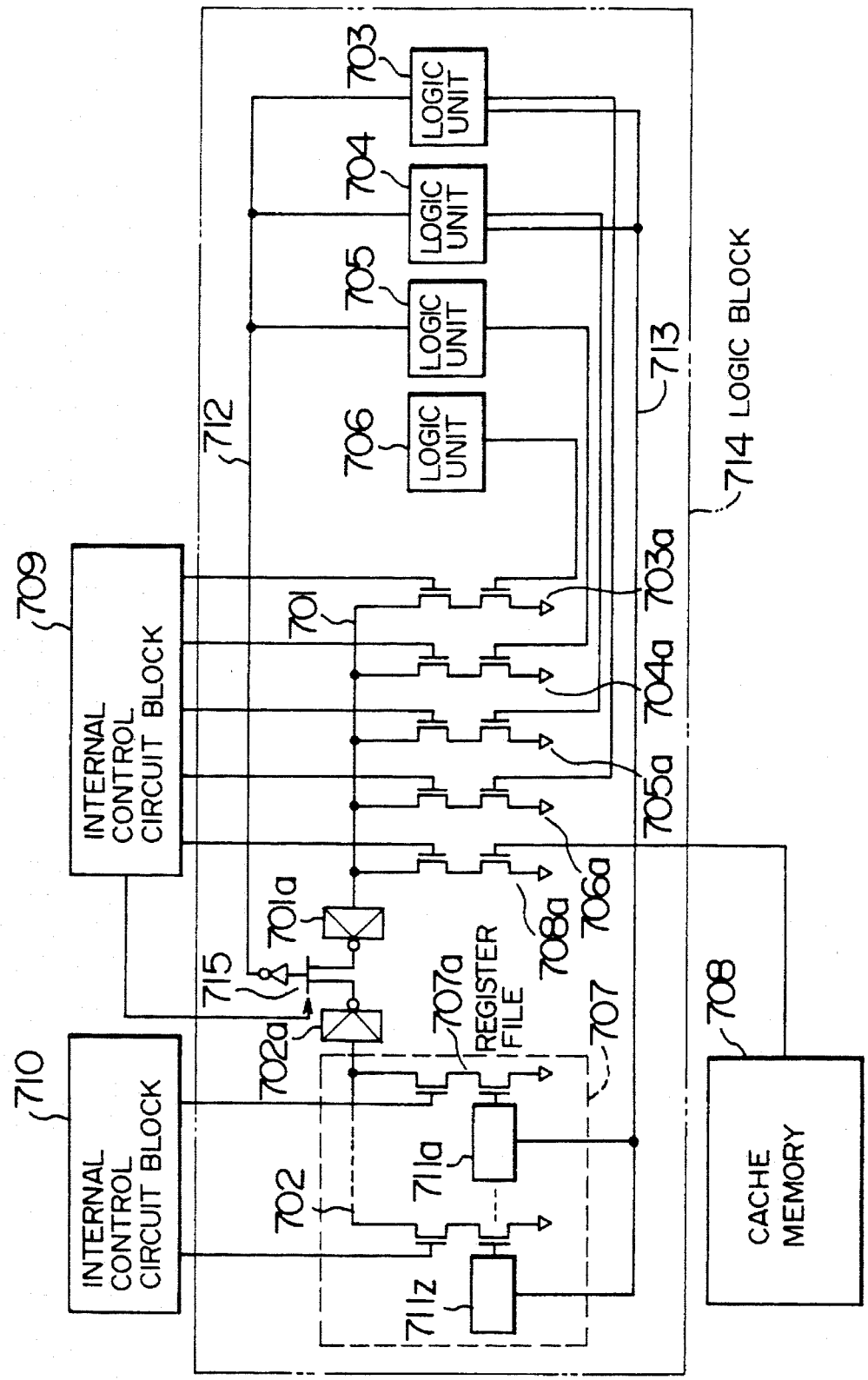
FIG. 7 is a block diagram showing a register file and a bypass circuit according to an embodiment of the present invention.

FIG. 7 shows another embodiment of this invention. This embodiment includes a register file and a bypass circuit to which the present invention is applied. Numerals 708, 709, 710, 714 denote logic circuit blocks. Of them, Numerals 709 and 710 denote control logic circuit blocks. Numeral 708 denotes a memory in which the data and instructions to be processed are stored. A numeral 714 denotes an operation logic circuit block which is a focal point of this embodiment. Numerals 703, 704, 705, 706 denote internal logic units contained in the block 714. A numeral 707 denotes a register file. Numerals 711a to 711z denote memory cells of a RAM or a ROM. A numeral 712 denotes a source bus through which the content of the register file is read and the data is inputted to each logic circuit block. The source bus 712 provides an I/O circuit out of the block. A numeral 713 denotes a target bus through which the output results of the logic units 703 to 706 are written in the register file. In this embodiment, the buses 712 and 714 have the same logic circuit amplitude as the normal CMOS circuit or BiCMOS circuit. Numerals 701 and 702 each denote a low-amplitude bus designed according to the concept of the invention.

Figure 19A:
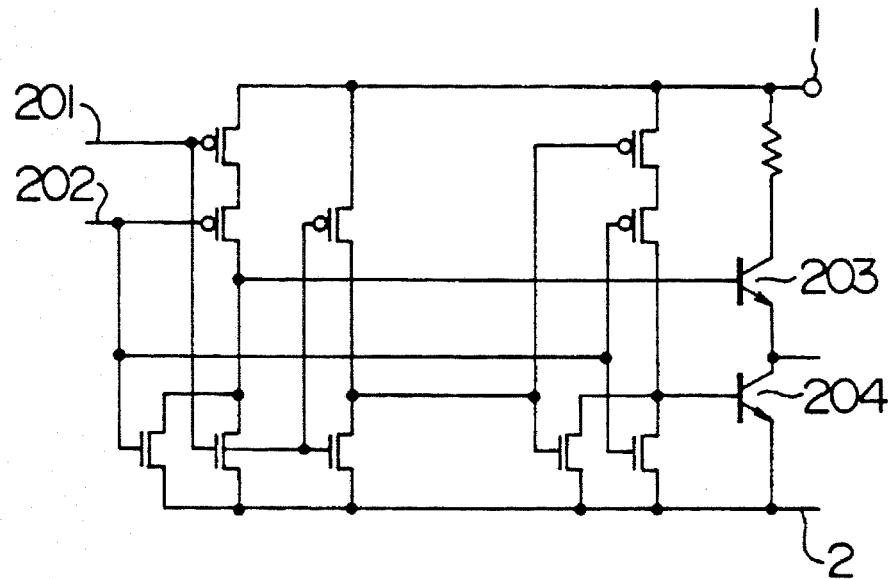
FIGS. 19A and 19B are conventional circuit diagrams showing a tri-state output buffer circuit and an input circuit used for the interface between logic blocks.
Figure 19B:
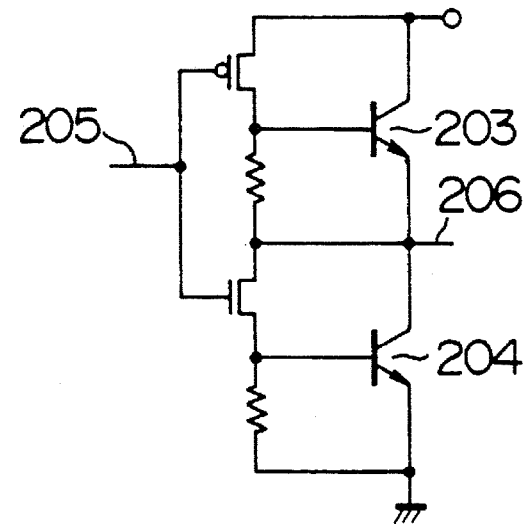
Figure 20:
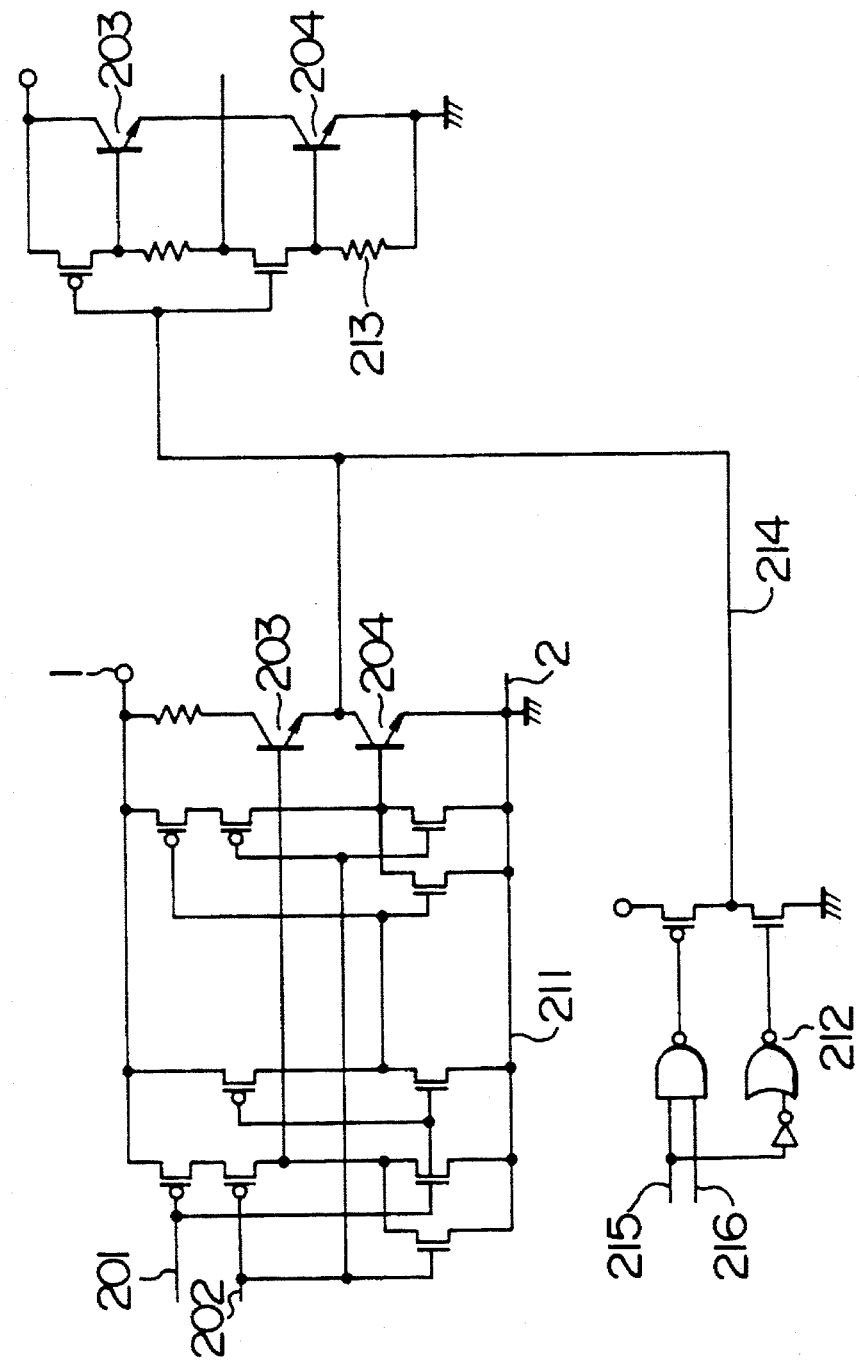
FIG. 20 is a circuit diagram showing a conventional I/O circuit.

Numerals 703a to 707a denote output portions according to the present invention. Numerals 701a and 702a are input portions according to the present invention, which are shown in FIGS. 4A and 4B. Herein, the description will be directed to the operation and the feature of the circuit shown in FIG. 7 including these output portions and input portions. The operational results of the internal logic units 703 to 706 are written from a target bus 713 to a register file 707. If this operational result is immediately used at the next step, the operational result is directly sent from the low-amplitude bypass bus 701 to the source bus 712. When the data from the memory 708 is directly loaded in the source bus 712, the data is directly sent from the low-amplitude bypass bus 701 to the source bus 712. Further, if the content of the register file 707 is read to the source bus 712, the low-amplitude bus 702 is used. This register file will be described in detail with respect to the next embodiment. When the operational results of the logic units 703 to 706 are bypassed to the source bus, the control logic circuit 709 supplies a control signal on which the operational result or data to be bypassed is selected from the logic units 703 to 706 and the cache memory 708. According to the control signal, one of the blocks 703a to 706a and 708a is selected and the selected operational result or data is read to the low-amplitude bus 701. The read operational result is sensed in the input circuit 701a comprised of a bipolar transistor and is inputted to a CMOS buffer circuit 715 provided with a selector. On the other hand, one of the data cells contained in the register file 707 is selected according to the control signal supplied by the control logic circuit block 710. Within the cells 711a to 711z, the data of the selected cell is read to the low-amplitude bus 702. The read data is sensed by the input circuit 702a and is input to the buffer circuit 715 with a selector. The circuit 715 serves to select one of the signal from the bypass circuit and the data of the register file and output it to the source bus 712. The largest effect of this embodiment is to speed up and reduce the area of the bypass circuit. If the bypass arrangement of this embodiment is implemented by the prior art shown in FIG. 19A, the source bus 712 is connected to six driver circuits. Since the six driver circuits occupy a large area, the overall area is made larger. On the other hand, according to this embodiment, just one driver circuit is connected to the source bus 712. Hence, the load capacitance of the source bus 712 can be reduced. Since the overall driver circuit occupies only a small area, the overall area of the driver circuit is made relatively small. This embodiment illustrates one-bit circuit arrangement for making the explanation easier. In actual, the circuit is comprised of multibits. For example, a 64-bit circuit arrangement includes the 64-repetition of a circuit arrangement shown in FIG. 7. The control lines from 709 and 710 are commonly connected to each bit block and a data line from a memory 708 is connected to each bit.

Figure 15:
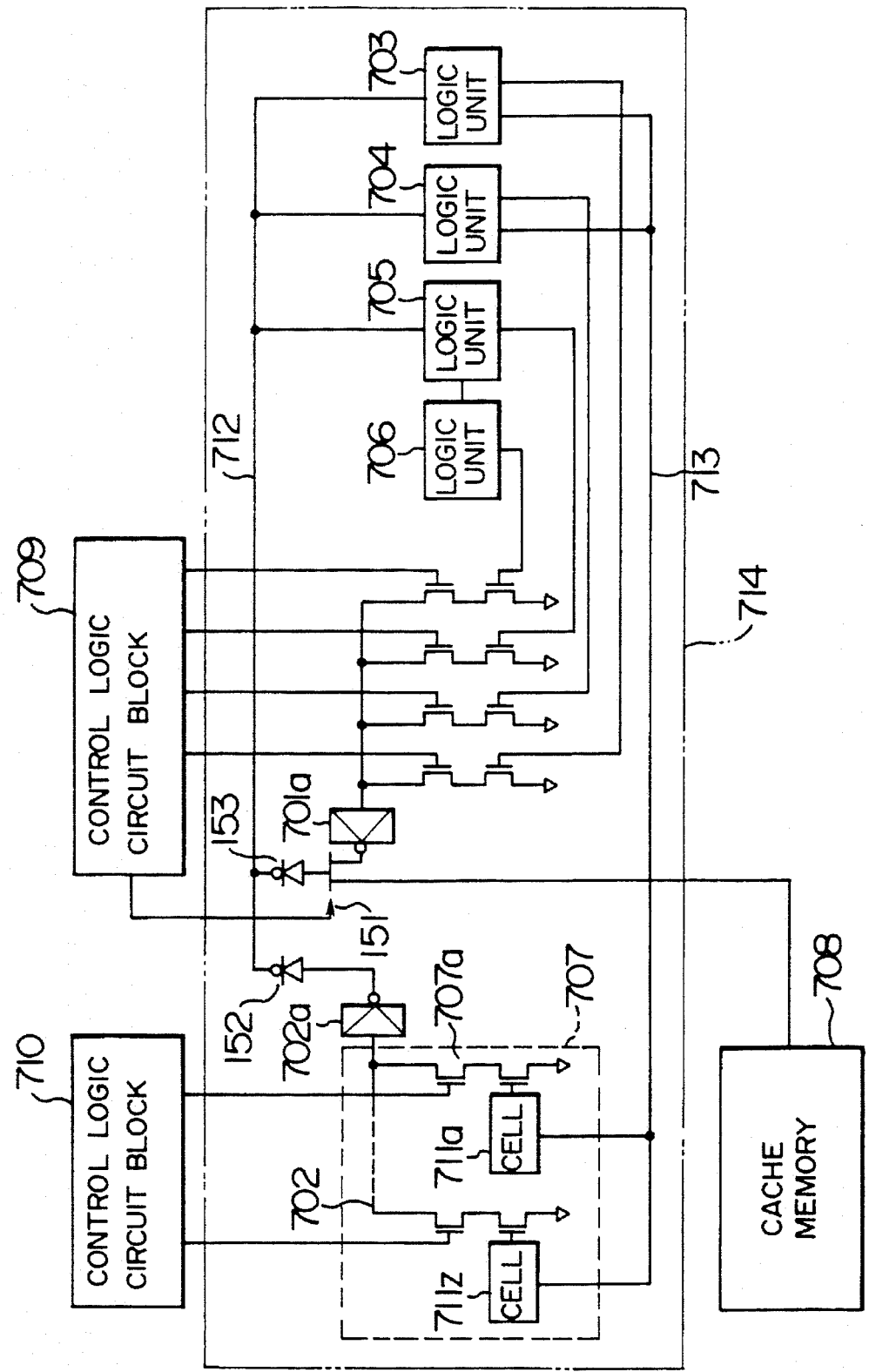
FIG. 15 is a circuit diagram showing a register file and a bypass circuit according to another embodiment of the present invention.

FIG. 15 shows a transformation of the embodiment shown in FIG. 7. The embodiment shown in FIG. 7 is arranged to output a signal from the memory 708 to the source bus 712 through the sensing circuit 701a, while the embodiment shown in FIG. 15 is arranged so that a selector 151 selects a signal from the memory 708 or a signal from the sensing circuit 701a and outputs the signal through the tri-state buffer 153 to the source bus 712. The arrangement needs to provide a tri-state buffer 152, which is a buffer for outputting the data of the register file 707 to the source bus 712. The feature of the arrangement shown in FIG. 15 is that the data read from the memory to each logic unit can be executed at a high speed, because the data from the memory is outputted to the source bus 712 without passing through the sensing circuit 701a.

Figure 16:
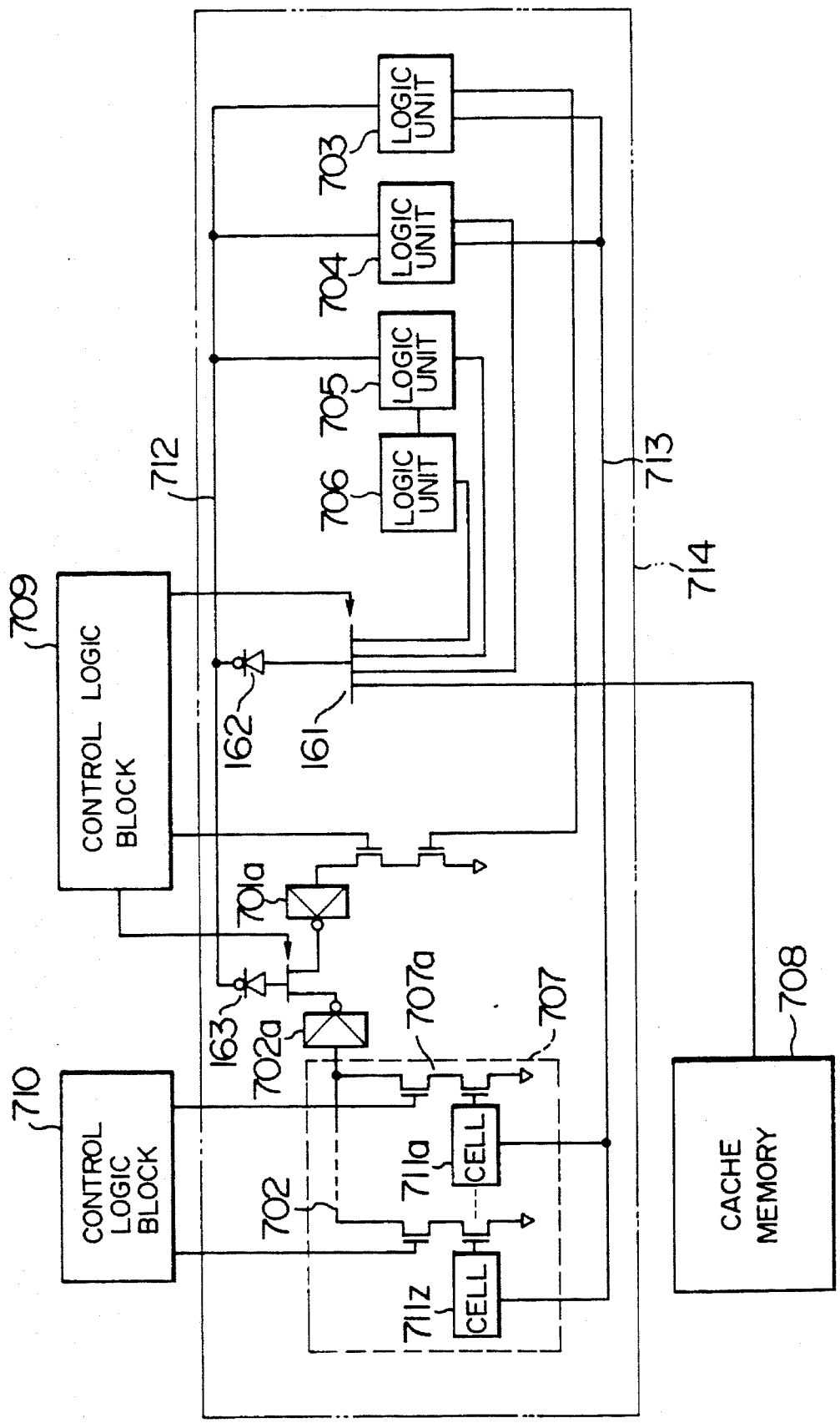
FIG. 16 is a circuit diagram showing a register file and a bypass circuit according to yet another embodiment of the present invention.

FIG. 16 is another transformation of the embodiment shown in FIG. 7. In this embodiment, one of the output signals from the memory 708 and the logic units 704, 705, 706 is selected by a selector 161 and is outputted from the tri-state buffer 162 to the source bus 712. This arrangement needs to provide a tri-state buffed 163 which is a buffer for outputting the data from the register file 707 to the source bus 712. The feature of the arrangement of the transformation shown in FIG. 16 is that the data read from the memory and the logic units 704, 705 and 706 to each logic unit can be executed at a high speed, because the data from the memory 708 and the output from the logic units 704, 705, 706 are outputted to the source bus 712 without passing through the sensing circuit 701a.

Figure 17:
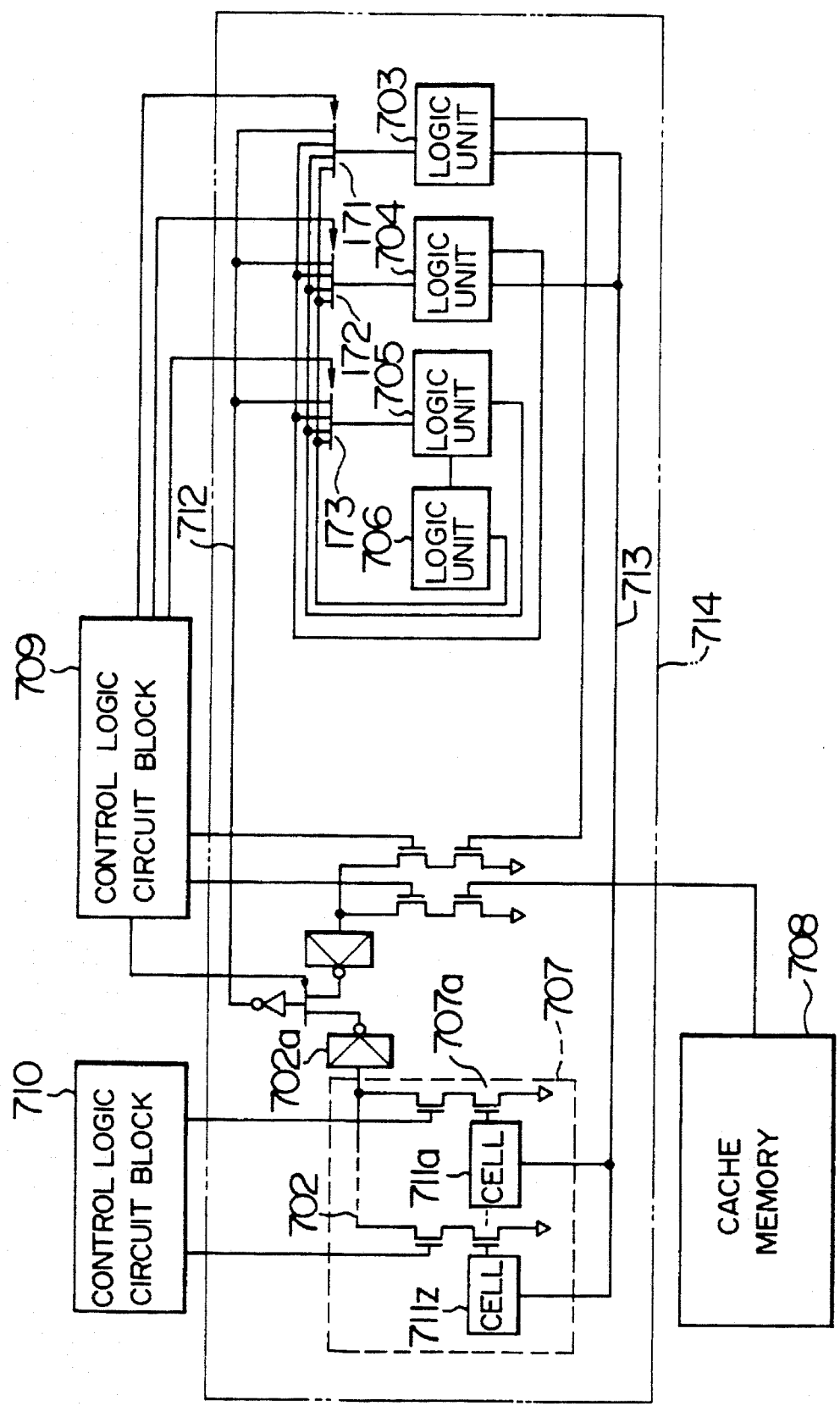
FIG. 17 is a circuit diagram showing a register file and a bypass circuit according to still another embodiment of the present invention.

FIG. 17 shows another transformation of the embodiment shown in FIG. 7. In this embodiment, the output signals from the logic units 704, 705 and 706 are directly returned to the logic units themselves without passing through the source bus 712. Then, selectors 171, 172 and 173 respectively select the data from the source bus and the outputs from the corresponding logic units. Each of the logic units reads the necessary data from the selected data. The feature of the arrangement shown in FIG. 17 is that the output data of the logic units 704 to 706 can be inputted to each of the logic units at a high speed, because the output signals from the logic units 704, 705, 706 are not sent on the source bus having a heavy load capacitance even without passing through the sensing circuit 701a.

Figure 18:
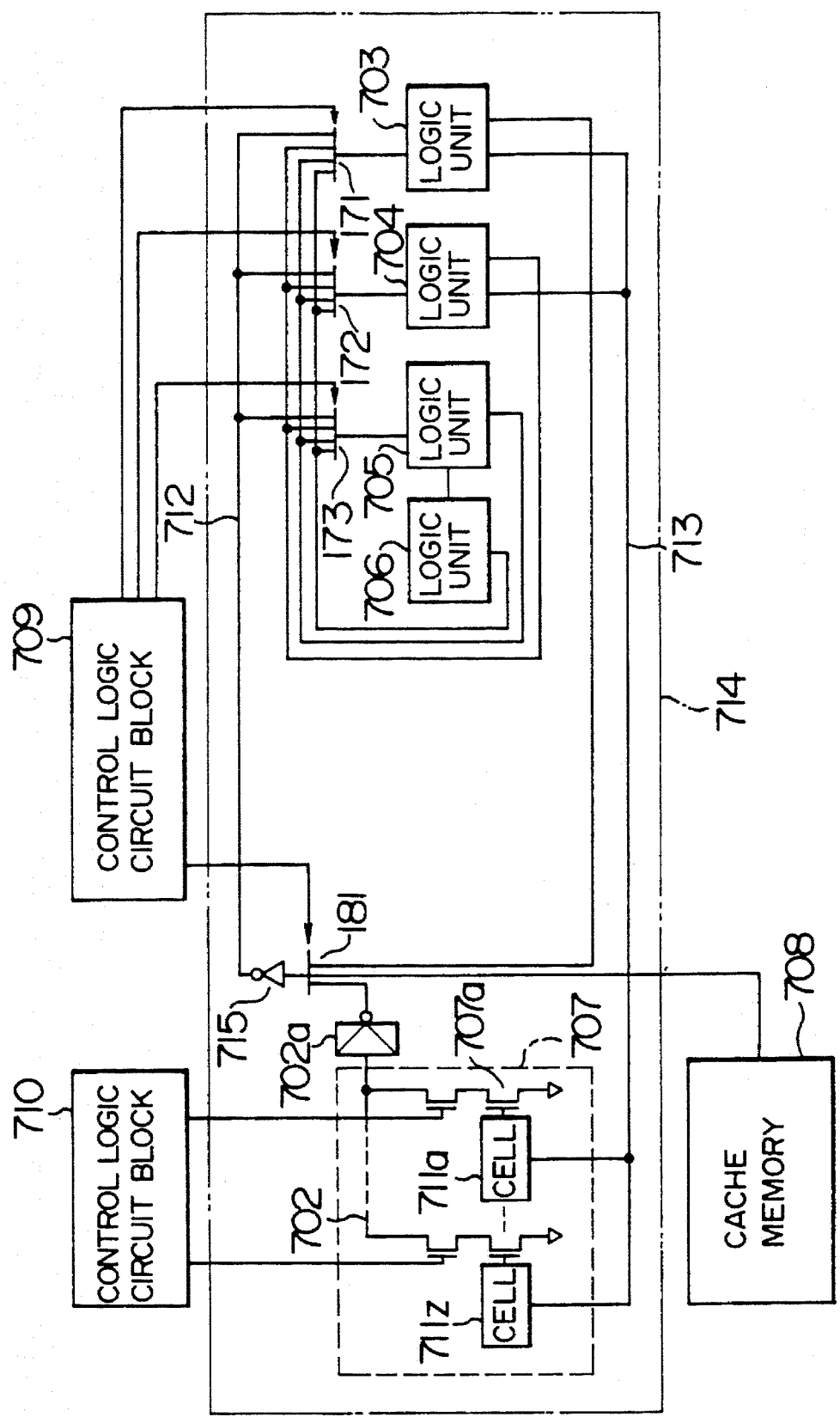
FIG. 18 is a circuit diagram showing a register file and a bypass circuit according to yet still another embodiment of the present invention.

FIG. 18 is a transformation of the embodiment shown in FIG. 17. In this embodiment, the output signals of the logic units 704 to 706 are directly sent back to the corresponding logic unit without passing through the source bus 712. The selectors 171, 172, 173 select the data from the source bus 712 and the outputs from the logic units, respectively. At a time, the outputs from the memory 708 and the logic unit 703 and the data from the register file are selected by the selector 181 and are outputted from the buffer 715 to the source bus 712. The feature of the arrangement shown in FIG. 18 in addition to the feature of the arrangement shown in FIG. 17 is that the data from the memory 708 and the logic unit 703 can be inputted to each logic unit at a high speed.

Figure 8:
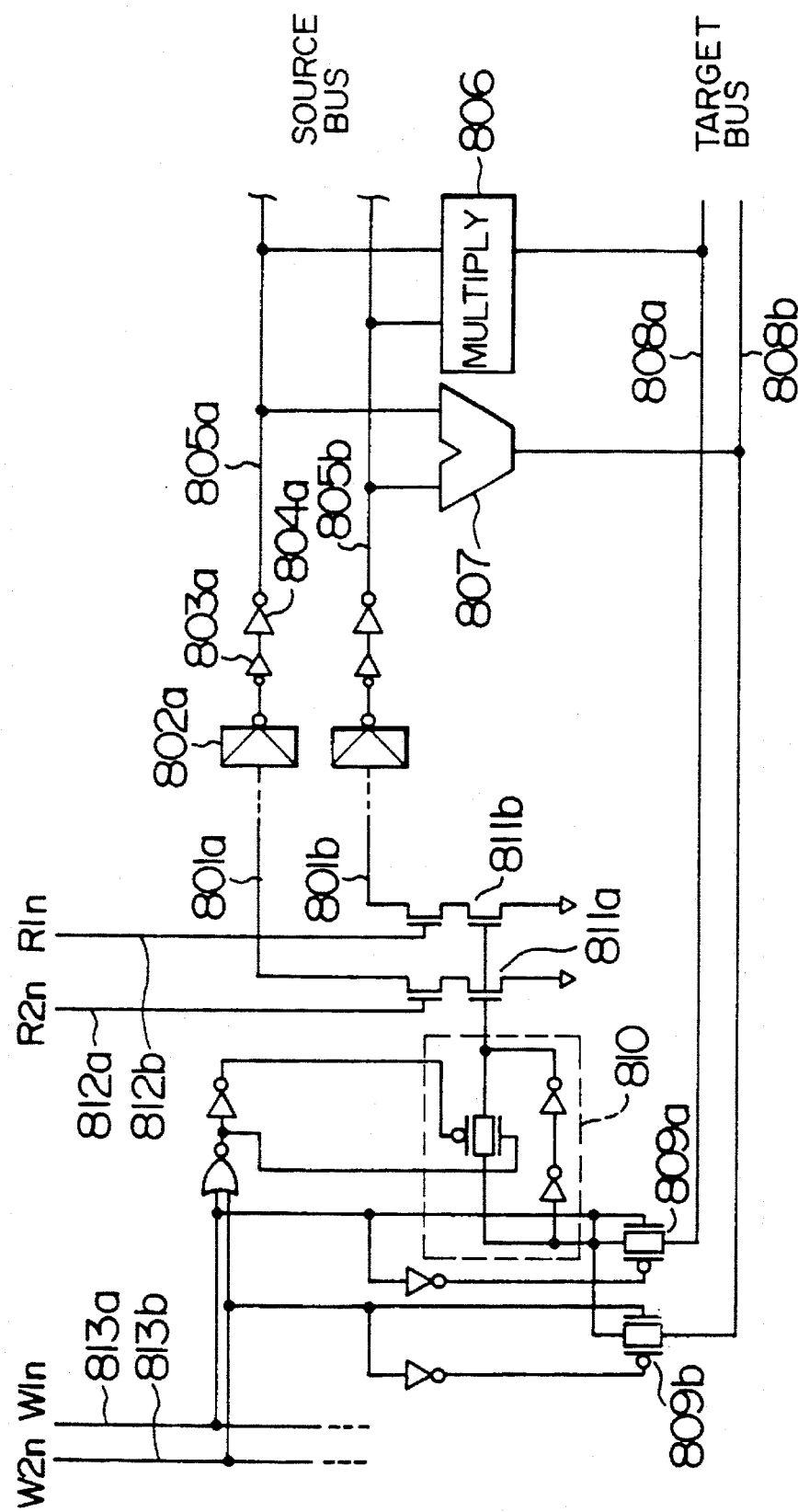
FIG. 8 is a block diagram showing a register file according to an embodiment of the present invention.

FIG. 8 shows an embodiment wherein the present invention is applied to the register file. In this embodiment, the register file has a 2-read and 2-write arrangement. However, the register file is allowed to have every bit and word. In particular, this embodiment is effective in speeding up the reading of the register file of a multi-word arrangement. It goes without saying that the number of reading and writing ports may be changed. A numeral 810 denotes a writable memory cell, which is connected to the output portions NMOS's 811a and 811b. The portion of the memory cell may employ a non-writable ROM. The write/read operation of the memory cell 810 is controlled by the address signals W1n, W2n, R1n, and R2n. When the address signals W1n and W2n are at logic "H", the write operation is allowed. When R1n and R2n are at logic "H", the read operation is allowed. The drains of the NMOS 811a and 811b are connected to the data lines 801a and 801b and then to the source buses 805a and 805b through the sensing circuit 802a, the amplifying circuit 803a, and the buffer circuit 804a shown in FIG. 4. 806 and 807 are logic units such as a multiplier and an ALU (Arithmetic Logic Unit), respectively. The logic units 806 and 807 are connected to target buses 808a and 808b, respectively, and serve to write the operational results in the register file 810. As will be obvious from the above arrangement, the feature of this embodiment is that the signal amplitude of the data lines 801a and 801b of the register file is as small as about 100 mV. If, therefore, the number of words in the register file is large and the load capacitance of a data line is heavy, the application of the I/O circuit according to the concept of the invention is effective in speeding up the reading of the register file and suppressing the occurrence of the noise. This embodiment has been concerned with one-bit circuit arrangement for making the explanation easier. The actual circuit has a multi-bit arrangement. For example, the 64-bit arrangement is 64 repetitions of the circuit arrangement shown in FIG. 8. The control lines W1n, W2n, R1n and R2n are commonly connected to each bit arrangement.

Figure 10:
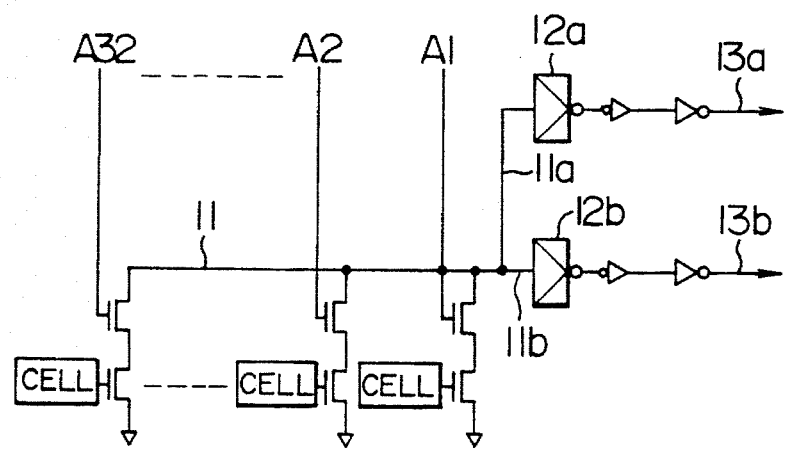
FIG. 10 is a circuit diagram showing a register file according to another embodiment of the present invention.

FIG. 10 shows another embodiment of the register file. One data line 11 is branched into lines 11a and 11b, which are connected to sensing circuits 12a and 12b, respectively. This embodiment makes it possible to read the content of one register file at two locations 13a and 13b. $A_1, A_2 \ldots A_{32}$ are control signals for switching an output portion of NMOS.

FIG. 12 shows an input circuit according to another embodiment of the present invention. The basic circuit arrangement and operation of this embodiment is the same as those of the circuit denoted by 103 of FIG. 5, except the following five respects. First, this embodiment has a latch circuit indicated by 121. Second, it has MOS transistors 122, 123, 125, 126 and a transfer gate 124 for cutting all d.c. current. Third, it has a MOS transistor 127 for cutting d.c. current only when the data is latched. Fourth, it has MOS resistors 128 and 129. Fifth, it has a constant voltage supply diode 120a. Next, the operation and the effect of the circuit will be described. When a CK signal is at "H", the latch circuit 121 serves to output a signal inverted from the output from the sensing circuit. When the CK signal is at "L", the inversion signal is kept. The circuit 121 has an additional function of shaping a waveform of the output signal from the sensing circuit. The signal outputted at the output terminal OUTN of the sensing circuit is substantially derived as VDD−0.8 V at high level and VSS+1.6 V at low level, where the first supply potential is VDD and the second supply potential is VSS. The latch circuit serves to shape the signal into such a full-amplitude signal as VDD at a high level or VSS at a low level. 122 to 126 are MOS transistors for cutting all d.c. current. When the signal at logic "L" is inputted to a d.c. control terminal ID, the MOS transistors 122, 123 and 125 are switched on and the MOS transistor 126 and the transfer gate 124 are switched off. Hence, the circuit operates normally as mentioned with respect to FIG. 5. When a signal at "H" is input to a d.c. current control terminal ID, the MOS transistors 122, 123, 125 are switched off for shutting d.c. current. The MOS transistor 126 is switched on so as to pull the voltage at the node OUTN up to VDD for holding the input signal of the latch circuit 121 at "H". This is for preventing through-current flowing through the latch circuit which results from an indeterminate signal level at the node OUTN. Further, for shutting the d.c. passage down, the transfer gate 124 is switched on so that the base is short-circuited with the emitter of the bipolar transistor 120b, resulting in switching off the bipolar transistor 120b. Such a function of shutting d.c. current is mainly used by evaluating the device characteristics of an LSI. Third, an NMOS 127 is an element for shutting part of d.c. current and reducing a power consumption of the circuit while the data is latched. At first, "L" is inputted to a d.c. current control terminal ID, when the NMOS 125 remains on. That is, the circuit is operative. The circuit of this embodiment is capable of propagating the data at high speed when the clock signal CK is at "H" and latching the data when the clock signal CK is at "L". Hence, when the clock signal CK is at "H", it needs the circuit to operate rapidly, while when the clock signal CK is at "L", it does not need the circuit to operate rapidly. By using the latching period, it is possible to reduce d.c. current only while the clock signal CK is at "L". The gate of the NMOS 127 is controlled by the clock signal CK. When the clock signal CK is at "H", the NMOS 127 is switched on so that emitter-follower current may flow through the bipolar transistor 120c. This makes it possible to normally operate the circuit at high speed. When the clock signal CK is at "L", the NMOS 127 is switched off so as to reduce the emitter-follower current of the bipolar transistor 120c. This control results in reduction in the power consumption of the circuit. Fourth, the use of MOS resistors 128 and 129 makes it possible to miniaturize a resistance element. Fifth, the use of a low-voltage diode 120a makes it possible to set a lower base voltage of a clamp transistor 120b for preventing saturation than the circuit shown in FIG. 5. This further lowers a low level at the node OUTN. Hence, the signal amplitude at the node OUTN can be made larger.

Figure 13:
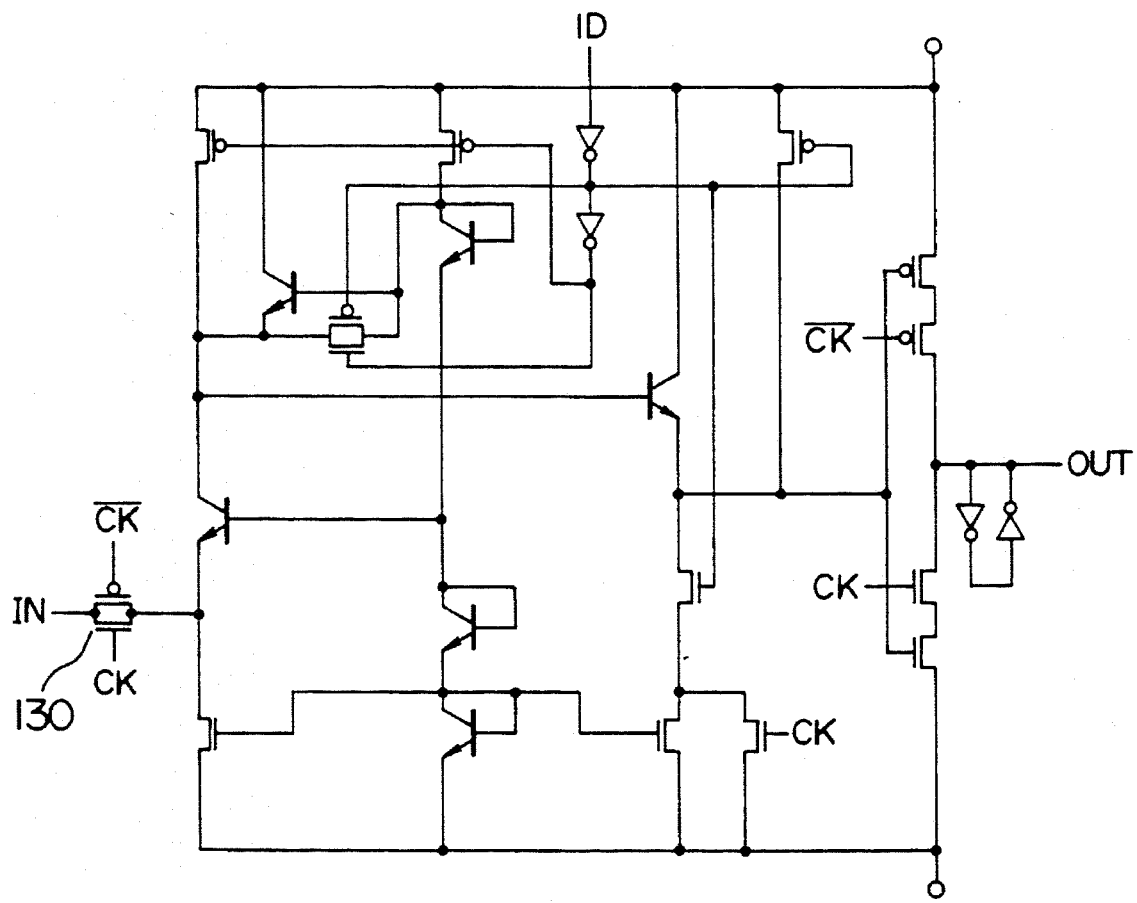
FIG. 13 is a circuit diagram showing an input circuit according to yet another embodiment of the present invention.

FIG. 13 shows an input circuit according to another embodiment of the present invention. The different respect of this embodiment from that shown in FIG. 12 is an addition of a transfer gate 130. While the clock signal CK is at "H", the transfer gate 130 is switched on. Hence, the circuit operates normally. While the clock signal CK is at "L", the data is latched. No data input is necessary. As a result, it is possible to switch off the transfer gate 130 and screen the d.c. passage. This makes it possible to further reduce the power consumption. The embodiments shown in FIGS. 12 and 13 may apply to all the applications of the circuit shown in FIG. 4.

Figure 14:
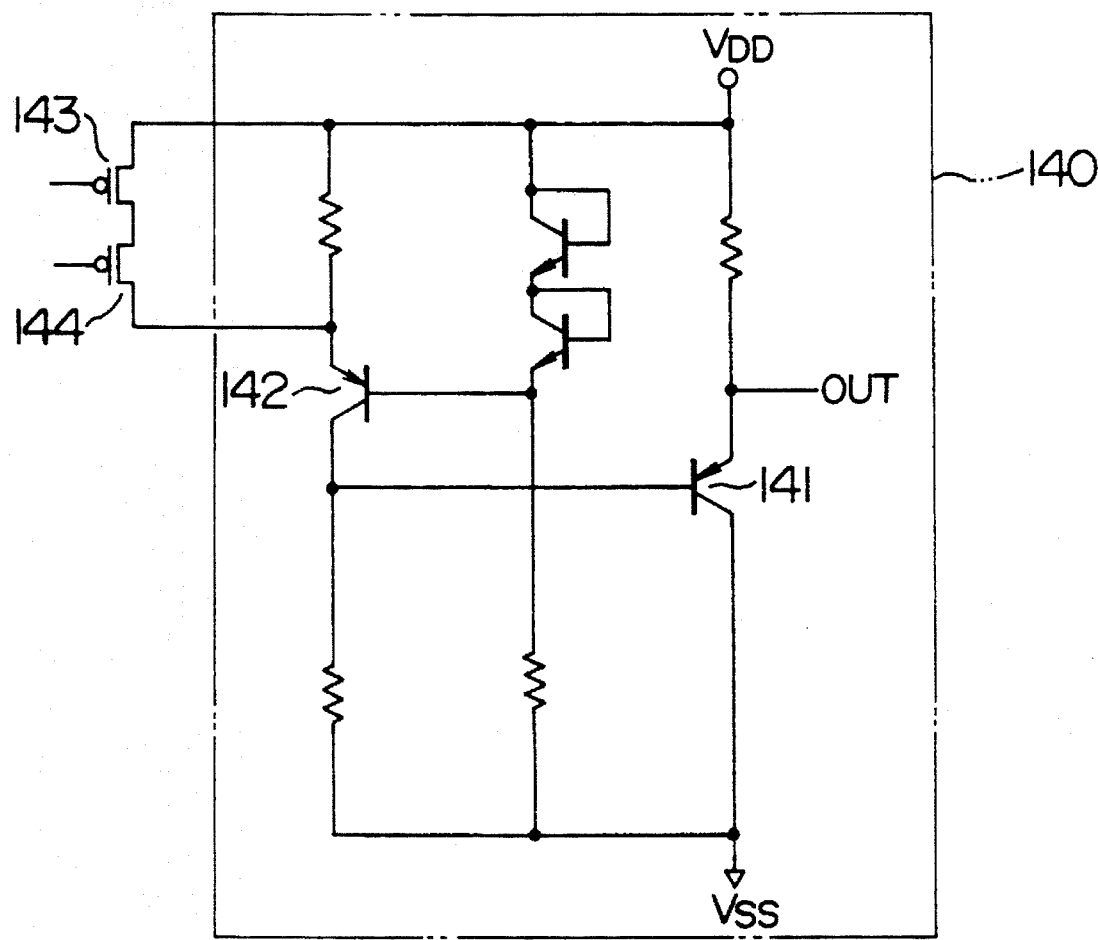
FIG. 14 is a circuit diagram showing an input circuit according to still another embodiment of the present invention.

FIG. 14 shows an input circuit according to another embodiment of the invention. The input circuit is enclosed by a block 140. The feature of this input circuit is the use of PNP transistors 141 and 142. The output circuit connected to this circuit arrangement is comprised of PMOS transistors denoted by 143 and 144. The foregoing embodiments using NPN transistors have a shorter rise time than a fall time. This results from an emitter follower of the NPN transistor. On the contrary, the circuit of this embodiment uses an emitter follower of the PNP transistor. Hence, the fall time of an output signal is shorter than the rise time.

Figure 11:
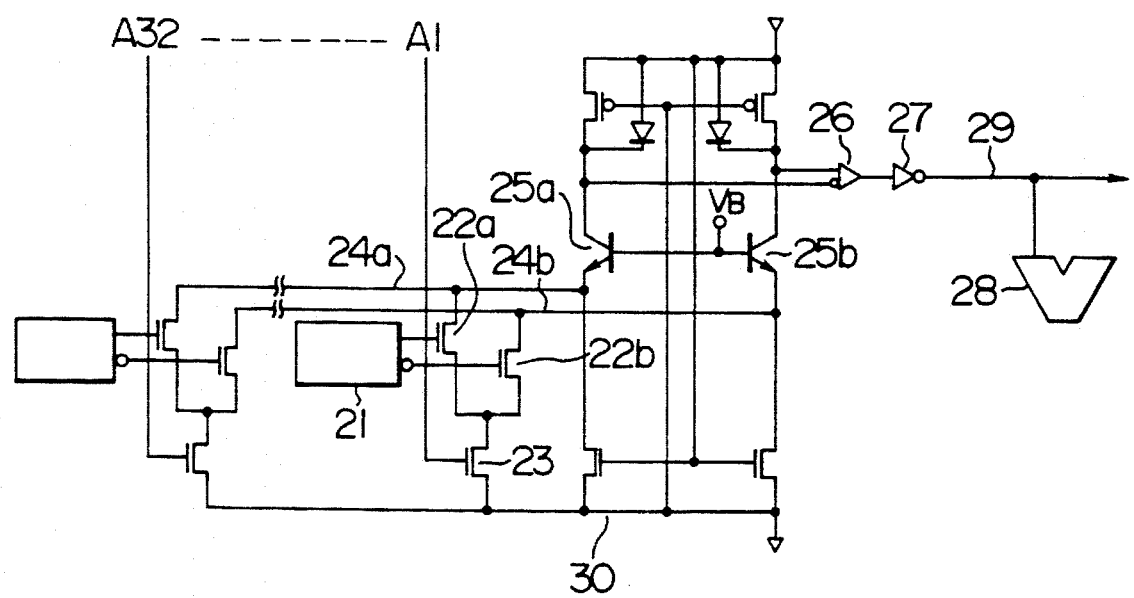
FIG. 11 is a circuit diagram showing a register file according to yet another embodiment of the present invention.

FIG. 11 is a register file according to another embodiment of the invention. This embodiment concerns with a differential register file. 21 is a memory cell which outputs a positive and a negative signals. These signals are inputted to the gates of the NMOS's 22a and 22b. 23 is an NMOS, which is controlled on and off by an address control signal A1. A differential signal is inputted to the differential sensing circuit 30 through data buses 24*a* and 24*b*. The output signal of the sensing circuit 30 is sent to a logic unit 28 through a differential amplifying circuit 26, a buffer circuit 27, and a source bus 29. The feature of this embodiment is that the low-amplitude data buses 24*a* and 24*b* are differential type. This produces high noise immunity capability.

A description will be directed to a preferred embodiment to which the principle of this invention applies.

Figure 21:
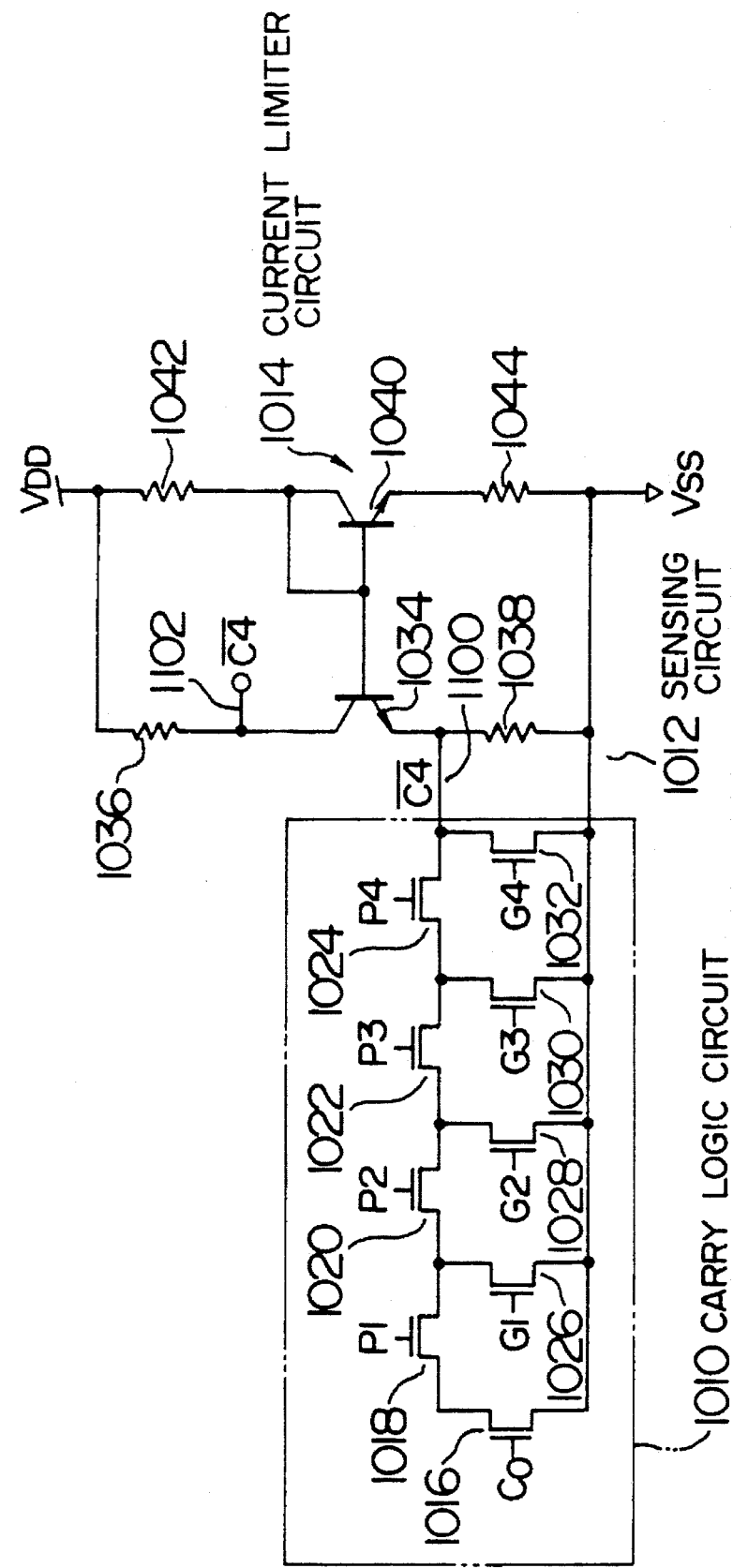
FIG. 21 is a circuit diagram showing a carry propagating device according to an embodiment of the present invention.

In FIG. 21, a carry propagating device is arranged to have a carry logic circuit 1010, a sensing circuit 1012 and a current limiter circuit 1014. The carry logic circuit 1010 employs a Manchester chain type carry propagating circuit, which is arranged to have MOS field-effect transistors (simply referred to as a MOS transistor) 1016, 1018, 1020, 1022, 1024, 1026, 1028, 1030, 1032. The sensing circuit 1012 is arranged to have a bipolar transistor 1034 and resistors 1036 and 1038. The current limiter circuit 1014 is arranged to have a bipolar transistor 1040 and resistors 1042 and 1044.

In the carry logic circuit 1010, the MOS transistors 1018, 1020, 1022, 1024 are arranged as a first MOS transistor group. Those MOS transistors are connected in series. One end of each MOS transistor is connected to an emitter of the bipolar transistor 1034 through an output terminal 1100. The other end is connected to the ground through the MOS transistor 1016 served as a third MOS transistor. The signals P1 to P4 are inputted to the gates of the MOS transistors 1018 to 1024, respectively. Those signals are based on the exclusive OR of two or more digital signals. A carry signal C0 is inputted to the gate of the MOS transistor 1016. A second MOS transistor group is comprised of MOS transistors 1026, 1028, 1030 and 1032. The MOS transistor 1032 is connected between both ends of the resistor 1038. The other MOS transistors 1026, 1028, 1039 are respectively connected to the series contacts of the MOS transistors 1018, 1020, 1022, 1024 and a second power supply Vss such as a ground of 0 V. Herein, the first power supply VDD (to be described later) is assumed as 3.3 V, for example. The carry logic circuit 1010 arranged as above serves to perform the logic operation according to the foregoing expressions (1) to (10). The carry logic circuit 1010 is arranged to generate a carry signal when a current passage is formed between an emitter of the bipolar transistor 1034 and the second power supply Vss such as the ground of 0 V. Such a current passage is formed when the MOS transistors 1016, 1018, 1020, 1022, 1024 are switched on in the state of the carry signal C0="1" (logic level "1") and the propagation signals P1=P2=P3=P4="1", when the MOS transistor 1032 is switched on in the state of the generation signal G4="1", or when the MOS transistors 1024 and 1030 are switched on in the state of the propagation signal P4="1" and the generation signal G3="1". Together with the generation of the carry signal, the inverted carry signal C4 at the logic="0" (logic level "0") is output as a four-digit carry signal. On the other hand, the carry signal is C0="0", the propagation signal is P1=P2=P3=P4="0", and the generation signal is G1=G2=G3=G4="0". When, hence, each MOS transistor is switched off, the current passage connecting between the emitter of the bipolar transistor 1034 and the second power supply V$_{ss}$ is shut down. This results in stopping the output of the carry signal. At this time, the inverted carry signal C4 has a logic of "1".

The bipolar transistor 1034 composing the sensing circuit 1012 has a collector served as an output. The collector of transistor 1034 is connected to an output terminal 1102 and a first power supply VDD such as 3.3 V through the resistor 1036 served as a first impedance element. The emitter is connected to the second power supply V$_{ss}$ through the resistor 1038 served as the second impedance element. The base of the bipolar transistor 1030 is connected to the base and the collector of the bipolar transistor 1040. The collector of the bipolar transistor 1040 is connected to the first power supply VDD through the resistor 1042 served as a third impedance element. The emitter of the transistor 1040 is connected to the second power supply V$_{ss}$ through the resistor 1044 served as a fourth impedance element. The current limiter circuit 1014 having the bipolar transistor 1040 and the resistors 1042 and 1044 serves as a reference voltage generator and applies a bias voltage set by the resistors 1042 and 1044 to the base of the bipolar transistor 1034. The bipolar transistors 1040 and 1034 form a current mirror circuit.

In the circuit arrangement, if the carry logic circuit 1010 generates no fourth-digit carry according to the logical operation of the input digital signal, that is, if no carry signal is generated, the output terminal 1100 has a logic of "1". This results in shut-down of the current passage connecting the emitter of the bipolar transistor 1034 to any one of the MOS transistors and the second power supply V$_{ss}$. As a result, the current from the emitter of the bipolar transistor 1034 is prevented from flowing except through the resistor 1038. Assuming that the current flowing through the resistor 1038 is I1, the current I1 flows through the bipolar transistor 1034. Hence, the potential at the output terminal 1102 is held at high level. Assuming that the resistance of the resistor 1036 is R, the potential at the output terminal 1102 can be represented as follows.

$$VOH=VDD-I1\cdot R \quad (15)$$

Next, a fourth-digit carry is generated by the logical operation performed according to the carry signal C0, the generation signals G1 to G4 and the propagation signals P1 to P4. When the carry logic circuit 1010 generates the carry signal, the output terminal 1100 is at a logic of "0". At this time, the current passage connecting the emitter of the bipolar transistor 1034 to the second power supply V$_{ss}$ is formed by any of the MOS transistors included in the carry logic circuit 1010. Hence, the emitter of the bipolar transistor 1034 serves to flow the current I1 through the resistor 1038 and thus flow the current I2 through the carry logic circuit 1010. The current I1+I2 flows through the collector of the bipolar transistor 1034. Hence, the logics of the output terminals 1102 and 1034 are inverted from a high level "1" to a low level "0". The electric potential at the output terminal 1102 can be represented by the following expression (15).

$$VOL=VDD-(I1+I2)\cdot R \quad (16)$$

As mentioned above, based on whether or not the current passage from the bipolar transistor 1034 to the second power supply V$_{ss}$ is formed, the potential at the output terminal 1102 can be represented by the expression (15) or (16). That is, when the output terminal is at a logic of "1", the potential can be represented by the expression (15). When the output terminal is at a logic of "0", the potential can be represented by the expression (16). As will be obvious from the operation, the static operation causes the carry logic generated in the carry logic circuit 1010 to be propagated to the output terminal 1102. That is, the carry signal can be propagated according to the carry logic operation of the carry logic circuit 1010 without having to use a clock signal. Further, since the amplitude of the carry signal is suppressed by the emitter voltage of the bipolar transistor 1034, the propagation of the carry signal can be implemented in the range of an amplitude of about 0.1 V. This results in speeding up the propagating speed of the carry signal, thereby speeding up the signal processing. That is, since the propagating speed of the signal is, in general, proportional to a value obtained by dividing the capacitance (contained in a signal line) X amplitude of signal (voltage) signal by current, it is possible to speed up the propagating speed of the signal by reducing the amplitude of the signal.

Next, a description will be directed to why the amplitude of the signal can be made lower by current-driving the bipolar transistor 1034 whose base is connected to the ground through the carry signal generated in the carry logic circuit 1010.

At first, no carry signal is generated from the carry logic circuit 1010 and only the current I1 flows through the bipolar transistor 1034. Assuming that the voltage between the base and the emitter of the bipolar transistor 1034 is VBE1 at that condition, the current I1 can be represented by the following expression (17).

$$I1 = I_0 \exp q/RT \cdot VBE1 \quad (17)$$

where $I_0$ is a saturation current, q is a charge amount, R is a Boltzmann's constant, and T is a temperature.

In turn, the carry signal generated in the carry logic circuit 1010 serves to invert the logic of the output terminal 1102 from "1" to "0", when the current (I1+I2) flows through the bipolar transistor 1034. At this condition, assuming that the voltage between the base and the emitter of the bipolar transistor 1034 is VBE2, the current (I1+I2) can be represented by the following expression (18)

$$I1+I2 = I_0 \exp q/RT \cdot VBE2 \quad (18)$$

From the expressions (17) and (18), the following expression can be derived.

$$VBE_1 - VBE_2 = RT/q \cdot \ln \cdot (I1+I2)/I1 \quad (19)$$

Since the base voltage of the bipolar transistor 1034 is constant, the voltage amplitude of the output terminal 1100 can be represented by the expression (19). Assume that the current I1=10 μA and the current I2=500 μA as concrete values. From the expression (19), the following expression (20) can be obtained.

$$VBE_1 - VBE_2 = 102 \, mV \quad (20)$$

As described above, the carry propagating device of the present embodiment is capable of reducing an amplitude of the carry signal into a quite small value. The reduction of the amplitude makes contribution to speeding up the propagating speed of the carry signal.

Next, the concrete value of the potential at the output terminal 1100 can be referred as follows. Assuming that VDD=3.3 V, I1=10 μA, I2=500 μA, and R (resistance of the resistor 1036)=3.4 KΩ, if no carry signal is generated, the output voltage can be represented as follows by the expression (15).

$$\begin{aligned} VOO &= 3.3 \, V - 10 \, \mu A \cdot 3.4 \, K\Omega \\ &= 3.3 \, V - 3.4 \times 0.01 \, V \\ &= 3.266 \, V \end{aligned}$$

On the other hand, if a carry signal is generated, the output voltage can be represented as follows by the expression (16).

$$\begin{aligned} VOO &= 3.3 \, V - (10 \, \mu A + 500 \, \mu A) \cdot 3.4 \, K\Omega \\ &= 3.3 \, V - 1.734 \, V \\ &= 1.566 \, V \end{aligned}$$

The value of the current I2 changes depending on the change of the number of the current paths connecting the output terminal 1100 to the second power supply $V_{ss}$. The number of the current paths changes according to the values of the carry signal C0, the generation signals G1 to G4, and the propagation signals P1 to P4. The value of the current I2 changes due to the variation of the supply voltage or the device performance. The change of the current I2 may cause excessive current to flow through the bipolar transistor 1034. This may result in saturating the bipolar transistor 1034. According to this embodiment, however, the bipolar transistors 1034 and 1040 compose a current mirror circuit so that the current flowing through the bipolar transistor 1034 is A times larger than the current flowing through the bipolar transistor 1040. This makes it possible to suppress the current flowing through the bipolar transistor 1034 to be the set current or less and thereby prevent the saturation of the bipolar transistor 1034. The coefficient A for determining the current flowing through the bipolar transistor 1040 and the current flowing through the bipolar transistor 1034 is set by the values of the resistors 1042, 1044 and 1038.

The above embodiment is concerned with the four-digit carry propagating device. The present invention may apply to not only the four-digit device but also a 8-digit, a 16-digit, a 32-digit and another-digit carry propagating devices. The resistors 1036, 1038, 1042, 1044 can be implemented by the resistors formed on a semiconductor substrate as well as the MOS transistors.

Next, a description will be directed to another embodiment of the invention as referring to FIG. 22.

The carry propagating device according to this embodiment provides the carry logic circuit 1010 and a sensing circuit 1012 like the embodiment shown in FIG. 21. Those circuits are formed on a semiconductor substrate. In place of the current limiter circuit 1014, a voltage limiter circuit 1046 is provided. That is, the foregoing embodiment (see FIG. 21) provides the current limiter circuit 1014 for limiting the flow of excessive current in the bipolar transistor 1034, while this embodiment provides the voltage limiter circuit 1046 for preventing the bipolar transistor 1034 from being saturated if the excessive current flows through the bipolar transistor 1034.

The voltage limiter circuit 1046 is arranged to have a bipolar transistor 1048, a resistor 1050, and diodes 1052, 1054, 1056. The voltage limiter circuit 1046 is arranged as a reference voltage generator. The forward voltage of the diodes 1054 and 1056 produces a first reference voltage. The forward voltage of the diodes 1052, 1054, 1056 produces a second reference voltage. The first reference voltage is applied to the base of the bipolar transistor 1034 and the second reference voltage is applied to the base of the bipolar transistor 1048. The emitter and the collector of the bipolar transistor 1048 connected to both ends of the resistor 1036. The bipolar transistor 1048 is arranged to be switched on and off according to the potential at the output terminal 1102 and suppress the potential at the collector of the bipolar transistor 1034 to be a base voltage or less if the excessive current flows through the bipolar transistor 1034.

In the above arrangement, if no carry signal is generated in the carry logic circuit 1010, the logic of the output terminal 1102 is kept at "1". If the carry signal is generated, the logic of the output terminal 1102 is reversed to "0". The emitter voltage of the bipolar transistor 1034 serves to suppress the carry signal for reducing the amplitude of the carry signal like the foregoing embodiment shown in FIG. 21. When the excessive current flows through the bipolar transistor 1034 so that the potential at the output terminal 1102 is made lower, the bipolar transistor 1048 is switched on and the current flowing through the resistor 1036 is branched into the bipolar transistor 1048. This results to stop lowering the voltage at the collector of the bipolar transistor 1034, thereby preventing the bipolar transistor 1034 from being saturated. Assuming that the forward voltage of the diodes 1054 and 1056 is VBE, the low level at the output terminal 1102 can be limited by the following expression.

$$VOL = 2VBE$$

That is, it is possible to prevent the potential at the collector of the bipolar transistor 1034 from being lower than the base potential. The diodes 1052, 1054, 1056 are diode-connected bipolar transistors.

Figure 23:
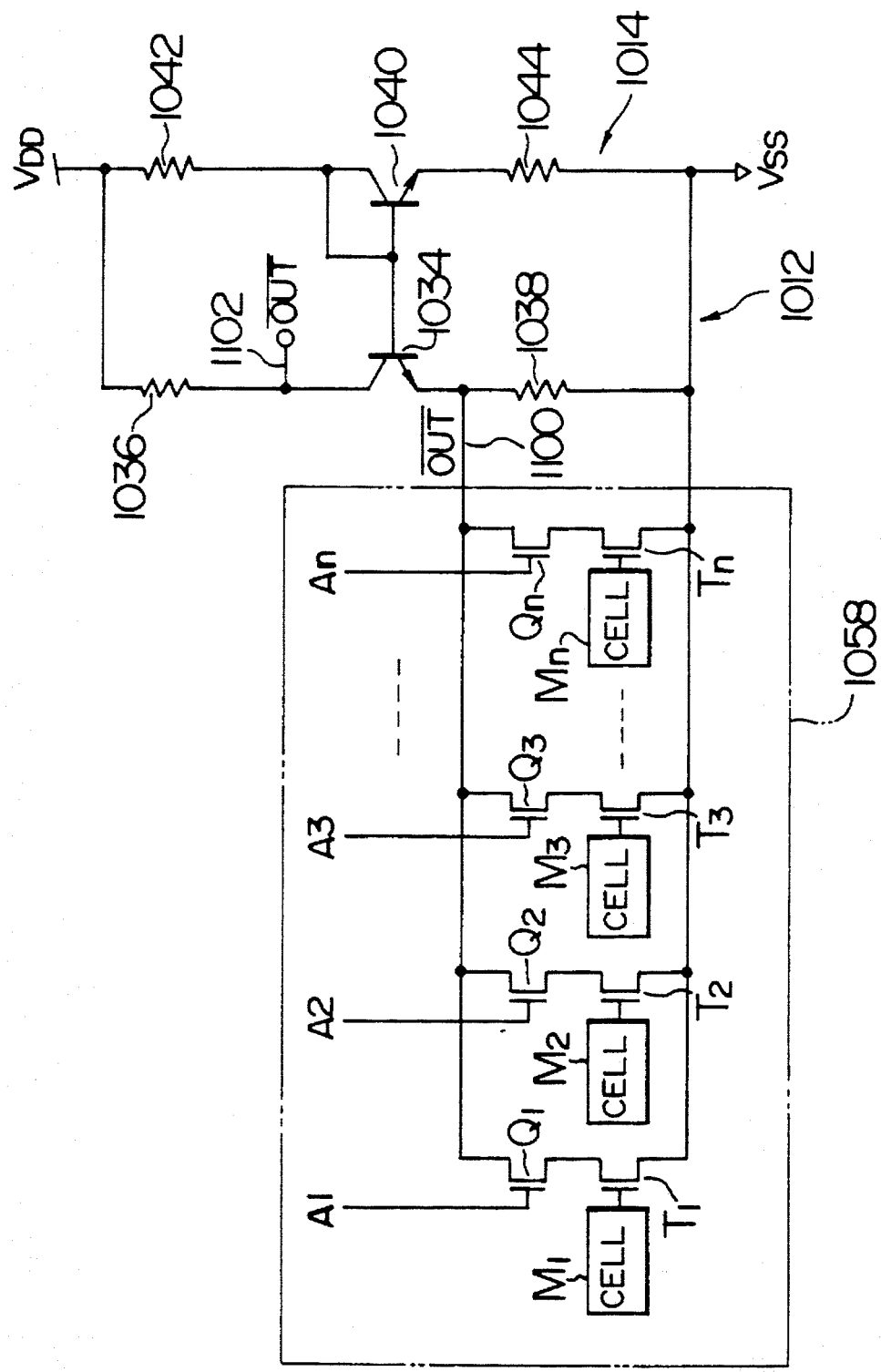
FIG. 23 is a circuit diagram showing a register file device according to an embodiment of the present invention.

In turn, the description will be directed to another embodiment of the present invention as referring to FIG. 23.

This embodiment concerns with the register file device in which the sensing circuit 1012 and the current limiter circuit 1014 of the embodiment shown in FIG. 21 are applied to a register file 1058. The components are formed on one semiconductor substrate.

The register file 1058 is arranged to provide MOS transistors Q1 to Qn, memory cells M1 to Mn, and MOS transistors T1 to Tn. Each one of the MOS transistors Q1 to Qn and the corresponding one of the MOS transistors T1 to Tn compose each pair. These pairs are connected in series. One end of each pair is connected to the emitter of the bipolar transistor 1034. The other end of each pair is connected to a second power supply $V_{ss}$. The gates of the MOS transistors Q1 to Qn are connected to read-out control lines A1 to An so that the MOS transistors Q1 to Qn are controlled by the values of the read-out control lines A1 to An. That is, when the logic of a digital signal being transmitted on each of the control lines A1 to An is at "1", the corresponding transistor is switched on. When the logic is at "0", the transistor is switched off. The gates of the MOS transistors T1 to Tn are connected to the memory cells M1 to Mn, respectively. The MOS transistors T1 to Tn are controlled by the digital data stored in the memory cells M1 to Mn, respectively. The memory cells M1 to Mn are composed of cells for a RAM and a ROM and serve as latch circuits for storing the logic "1" or "0" as digital data.

In the above arrangement, when the memory cells M1 to Mn store the data of logic "0", the MOS transistors T1 to Tn are switched off. Hence, if the MOS transistors Q1 to Qn are switched on according to the logics of the digital signals being transmitted on the control lines A1 to An, respectively. The current path connecting the emitter of the bipolar transistor 1034 to the second power supply $V_{ss}$ is shut down. This results in maintaining the logics of the output terminals 1100 and 1102 at "1".

On the other hand, when the data stored in any one of the memory cells M1 to Mn has a logic of "1", the MOS transistor connected to that memory cell is switched on. For example, when the data of the memory cell M1 is "1", the MOS transistor T1 is switched on. At a time, when the digital data being transmitted on the control line A1 is "1", the MOS transistor Q1 is switched on, so that the current path connecting the emitter of the bipolar transistor 1034 to the second power supply $V_{ss}$ may be formed by the MOS transistors Q1 and T1. Hence, the signal of a logic "0" appears at the output terminals 1100 and 1102. That is, the inverted signal of the data of the memory cell M1 is outputted at the terminals 1100 and 1102. When the data is read out to the output terminal 1102, the amplitude of the data signal is limited by the emitter voltage of the bipolar transistor 1034. This results in reducing the amplitude of the data signal, thereby increasing the data transmission speed. If the current flowing through the bipolar transistor 1034 may be excessive depending on the value of the data signal, like the embodiment shown in FIG. 21, the current mirror circuit comprised of the bipolar transistors 1034 and 1040 serves to limit the flow of excessive current in the bipolar transistor 1034.

Figure 24:
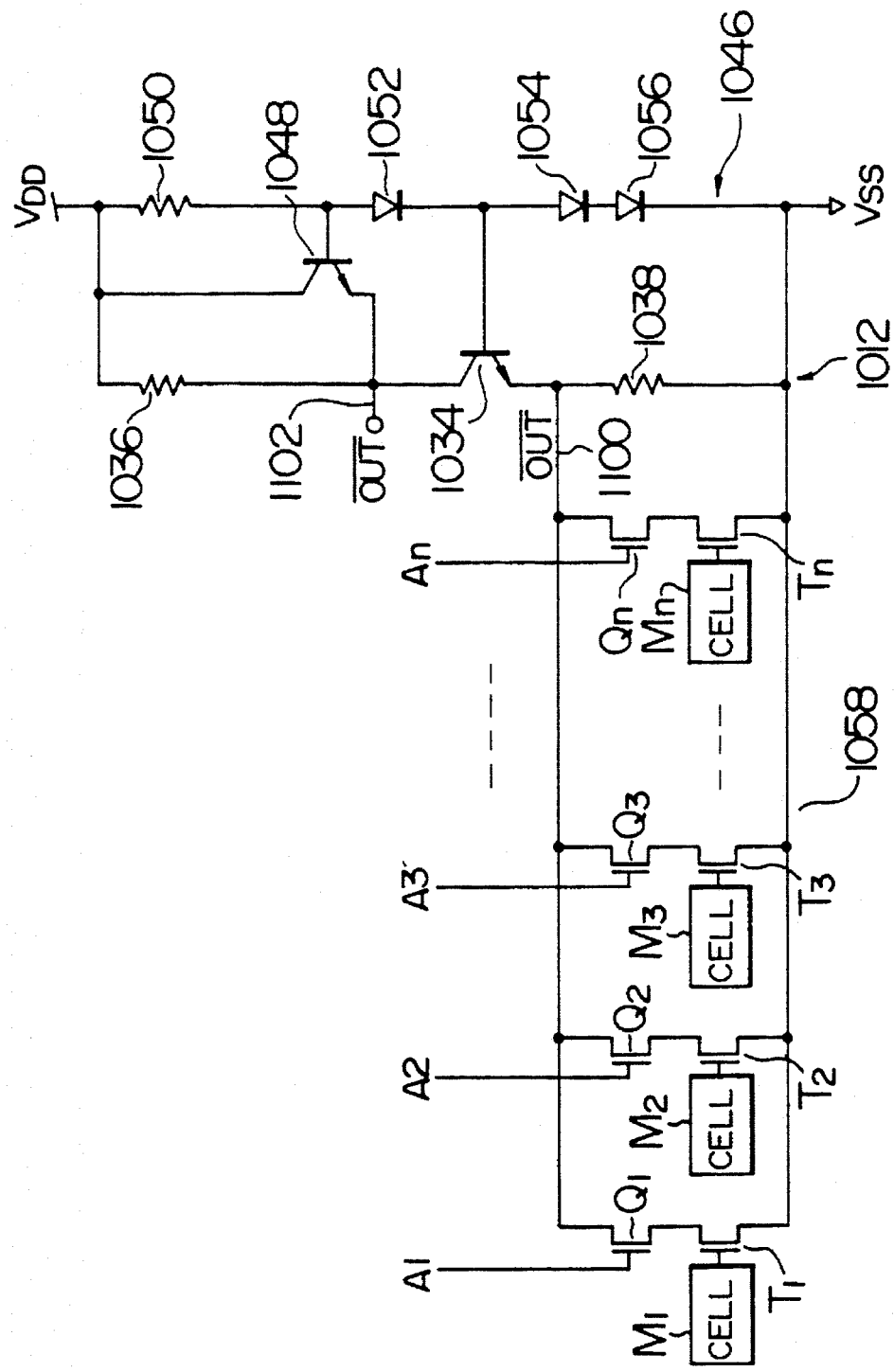
FIG. 24 is a circuit diagram showing a modification of the device shown in FIG. 23.

Next, a description will be directed to another embodiment with reference to FIG. 24.

The register file device according to this embodiment is arranged to provide the register file 1058, the sensing circuit 1012 and the voltage limiter circuit 1046 in combination. Those components are mounted on one semiconductor substrate. This embodiment is the same as the previously described embodiment except that in place of the current limiter circuit 1014 shown in FIG. 23, the voltage limiter circuit 1046 is provided. Hence, the description about the concrete operation is left out.

Like the embodiment shown in FIG. 23, the register file device of this embodiment is capable of supplying an inverted signal of the data stored in the memory cell from the output terminal 1102 and reducing the amplitude of the data signal. Like the embodiment shown in FIG. 22, if the excessive current flows through the bipolar transistor 1034, it is possible to prevent the bipolar transistor 1034 from being saturated.

Figure 25:
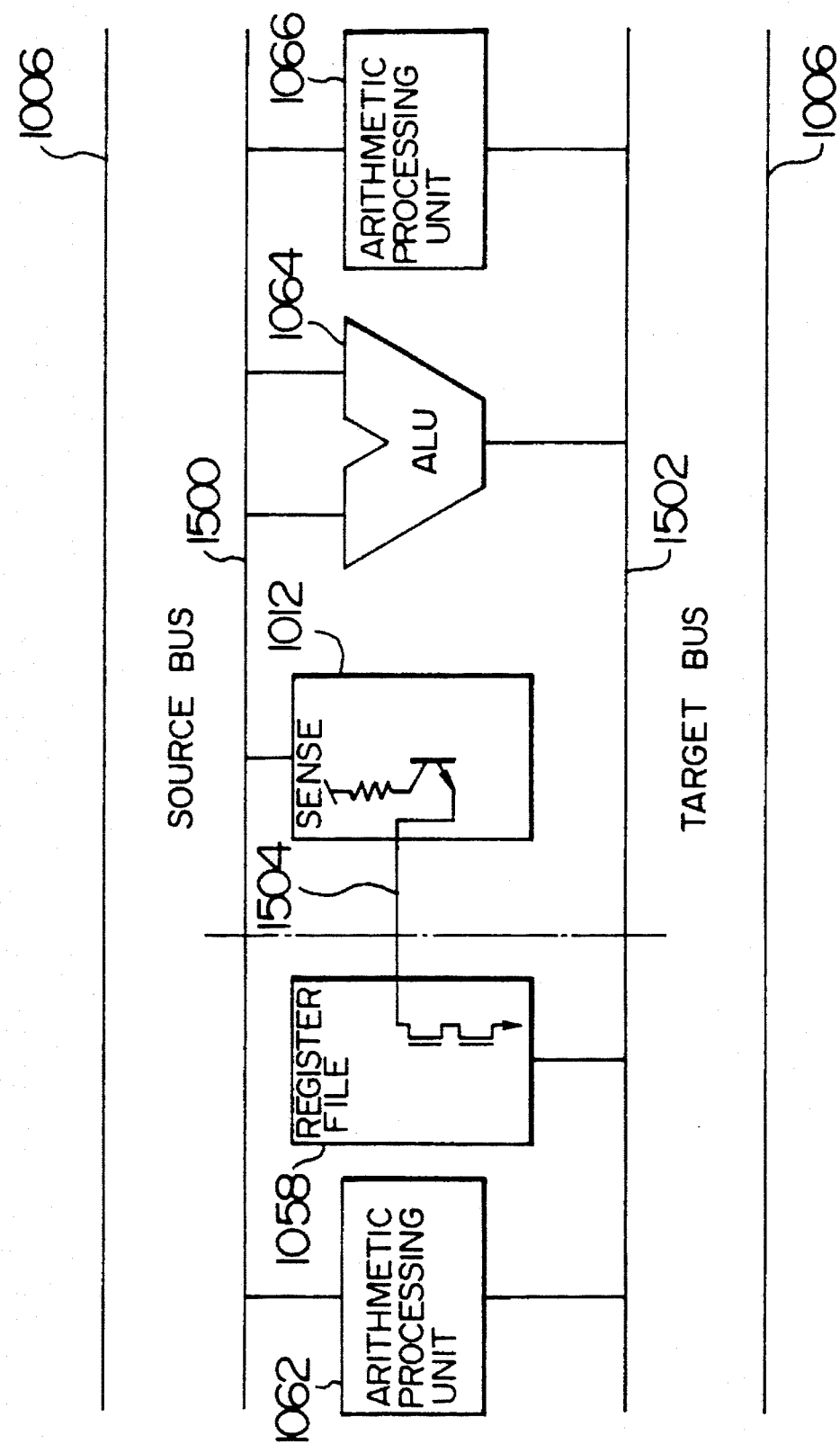
FIG. 25 is a block diagram illustrating a semiconductor integrated circuit according to an embodiment of the present invention.
Figure 26:
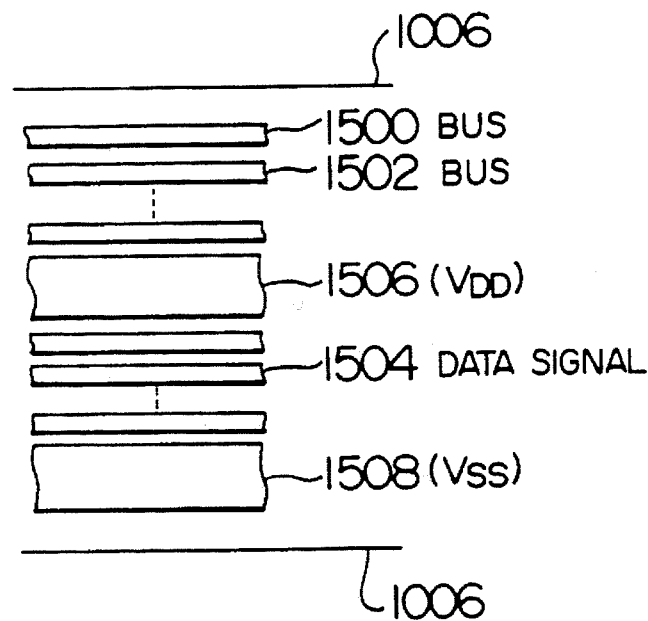
FIG. 26 is a view showing a layout of signal wires contained in a circuit device according to an embodiment of the present invention.
Figure 27:
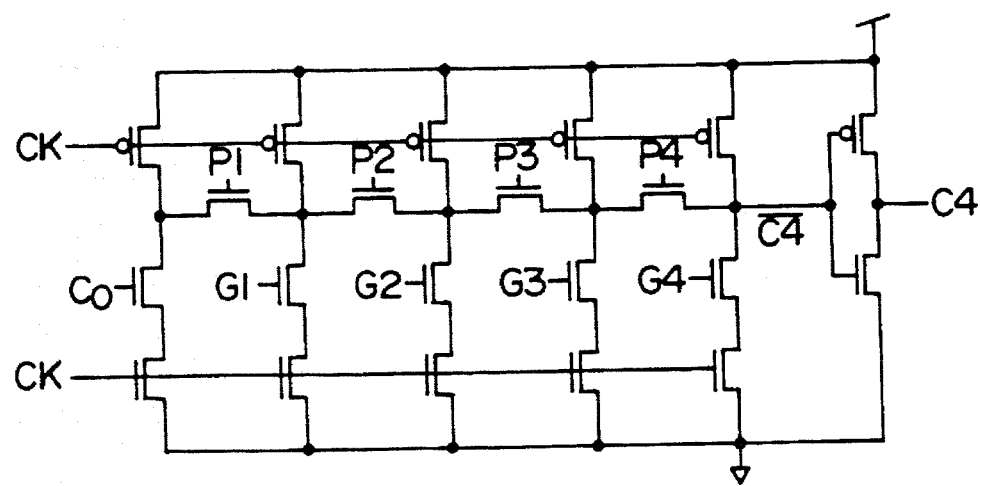
FIG. 27 is a circuit diagram illustrating a conventional carry propagating device.
Figure 28:
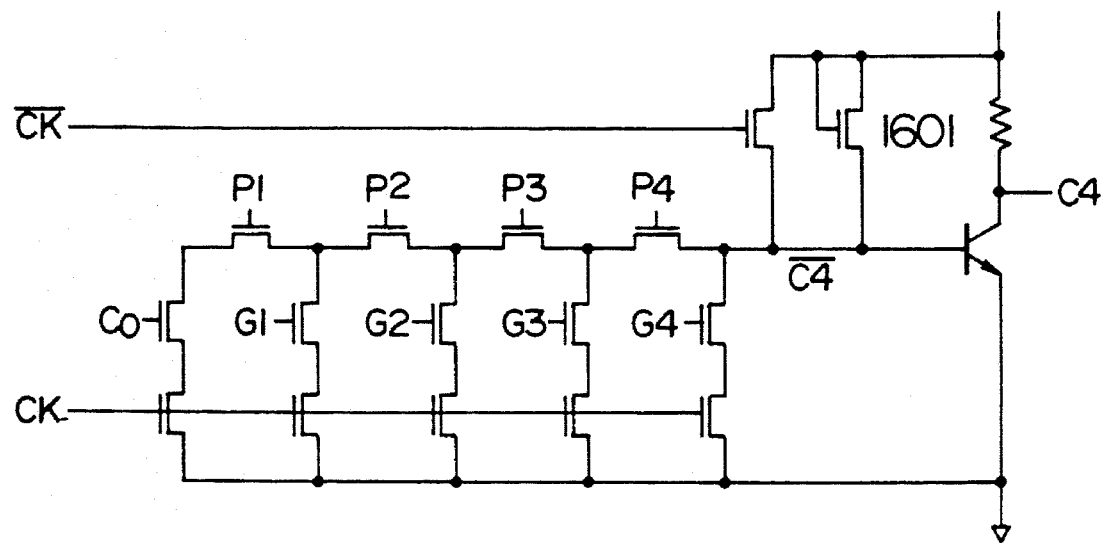
FIG. 28 is a circuit diagram illustrating another conventional carry propagating device.

Next, a description will be directed to the layout arranged when the register file 1058, the sensing circuit 1012 and the current limiter circuit 1014 are mounted on the semiconductor substrate with reference to FIGS. 25 and 26. Those components are included in the foregoing embodiments.

In FIG. 25, an arithmetic processing unit 1062, a register file 1058, the sensing circuit 1012, an arithmetic logic unit (ALC) 1064, and an arithmetic processing unit 1066 are formed on the same semiconductor substrate 1006. Each circuit unit is connected to a source bus 1500 and a target bus 1502. The data is inputted from the source bus 1500 to the arithmetic processing unit 1062, the sensing circuit 1012, a data path 1054, the ALC 1064, and the arithmetic processing unit 1066. The data is outputted from the arithmetic processing unit 1062, the register file 1058, the ALU 1064, and the arithmetic processing unit 1066 to the target pus 1502. When a data signal line and a power supply line are wired on the substrate 1060, a planar layout as shown in FIG. 26 is employed. That is, in the fundamental wiring pattern, like the data signal line 1504 connecting the register file 1058 to the sensing circuit 1012, the data signal line whose voltage amplitude is made smaller, that is, the data path 1054 is wired between a power supply line 1508 connected to the second power supply $V_{ss}$ and a power supply line 1506 connected to the first power supply VDD. Outside of the power supply line 1506, there is wired signal lines such as the source bus 1500 and the target bus 1500. On those signals, the signal of a larger voltage amplitude is being transmitted rather than on the data signa line 1504. The planar layout shown in FIG. 26 can be a laminated wiring layer described below.

By using such a layout, the data signal line 1504 is electrically separated from the source bus 1500 and the target bus 1502. Hence, it is possible to prevent the occurrence of the noise resulting from overlapping the signal transmitted on the source bus 1500 and the target bus 1502 with the signal transmitted on the data signal line 1504.

The wiring layers such as a data signal line and a power supply line are formed on the same substrate (for example, silicon substrate) in order to form a multi-layer structure. The group of signal lines for data transmission is divided into two subgroups depending on the voltage amplitude. On the same substrate, each sub-group of signal lines is formed on the corresponding wiring layer different from the wiring layer of the other sub-group. The wiring layer on which the power supply line is wired is disposed between a pair of wiring layers on which the groups of signal lines having a smaller voltage amplitude are wired. On the resulting layers, there is formed a wiring layer on which a group of signal lines having a larger voltage amplitude are wired. As a result, noise from the group of signal lines having a larger voltage amplitude is prevented from being overlapped on the signal being transmitted on the group of signal lines having a smaller voltage amplitude, resulting in avoiding the occurrence of the noise.

As described above, according to this embodiment, the signal can be propagated without depending on the clock signal. Hence, the transmission of the signal can be executed on any timing without depending on the generating period of the clock signal. The transmission amplitude of the signal is limited by the emitter voltage of the bipolar transistor. The amplitude of the signal is made smaller. This makes contribution to increasing the transmission speed and speeding up the data processing. Further, the signal line having a smaller voltage amplitude is inserted between a pair of power supply lines so as to be electrically separated from the signal line having a larger voltage amplitude. This results in improving the signal-to-noise ratio.

What is claimed is:

1. A carry propagating device comprising a group of first switching elements which are switch-controlled on a basis of a logic function performed on a plurality of digital signals, a group of second switching elements which are switch-controlled on a basis of a different logic function performed on said digital signals, a third switching element responding to a carry signal, a bipolar transistor, and first and second impedance elements, wherein:

said bipolar transistor has a collector serving as an output terminal and is connected to a first power supply terminal, included in said device, through said first impedance element, an emitter connected to a second power supply terminal, included in said device, through said second impedance element, and a base connected to a fixed potential source;

said first switching elements are connected in series to one another, the series connection of said first switching elements having one of two ends thereof connected to the emitter of said bipolar transistor and having the second of said two ends thereof connected to said second power supply terminal through said third switching element; and one of said second switching elements is connected in parallel to said second impedance element and each one of the remaining said second switching elements is connected between a common connection of a respective pair of adjacent ones of said first switching elements and said second power supply terminal.

2. A carry propagating device according to claim 1, wherein the groups of said first and second switching elements, said third switching element, said bipolar transistor and said first and second impedance elements are formed on one substrate; and wherein there are provided, on said substrate, digital signal lines which are divided into two groups depending on the magnitude of a voltage amplitude being applied thereto, the group of signal lines applied with a smaller one of voltage amplitudes are located between a pair of parallel-directioned power supply wiring lines, and the group of signal lines being applied with a second, larger voltage amplitude are located between adjacent groups of signal lines applied with the smaller voltage amplitude.

3. A carry propagating device according to claim 1, wherein the groups of said first and second switching elements, said third switching element, said bipolar transistor and said first and second impedance elements are formed on one substrate; and wherein there are provided, on said substrate, signal lines for digital transmission which are divided into two groups depending on the magnitude of a voltage amplitude being applied thereto, a wiring layer constituted by a group of signal lines applied with a smaller one of voltage amplitudes is interposed between a pair of wiring layers on which the power supply lines are wired, and another wiring layer constituted by a group of signal lines applied with a larger voltage amplitude is laminated on the layers, the wiring layer having power supply lines being disposed between wiring layers having a group of signal lines applied with the smaller voltage amplitude.

4. A carry propagating device comprising a group of first switching elements which are switch-controlled on a basis of an exclusive OR of a plurality of digital signals, a group of second switching elements which are switch-controlled on a basis of a logic AND of said digital signals, a third switching element responding to a carry signal, a bipolar transistor, and first and second impedance elements, wherein:

said bipolar transistor has a collector serving as an output terminal and is connected to a first power supply terminal, included in said device, through said first impedance element, an emitter connected to a second power supply terminal, included in said device, through said second impedance element, and a base connected to a fixed potential source;

said first switching elements are connected in series to one another, the series connection of said first switching elements having one of two ends thereof connected to the emitter of said bipolar transistor and having the second of said two ends thereof connected to said second power supply terminal through said third switching element; and one of said second switching elements is connected in parallel to said second impedance element and each one of the remaining said second switching elements is connected between a common connection of a respective pair of adjacent ones of said first switching elements and said second power supply terminal.

5. A carry propagating device comprising a group of first MOS transistors which are controlled on a basis of an exclusive OR of a plurality of digital signals, a group of second MOS transistors which are controlled on a basis of a logic AND of said digital signals, a third MOS transistor responding to a carry signal, a bipolar transistor, and first and second impedance elements, wherein:

said bipolar transistor has a collector serving as an output terminal and is connected to a first power supply terminal, included in said device, through said first impedance element, an emitter connected to a second power supply terminal, included in said device, through said second impedance element and a base connected to a fixed potential source;

said first MOS transistors are connected in series to one another, the series connection of said first MOS transistors having one of two ends thereof connected to the emitter of said bipolar transistor and having the second of said two ends thereof connected to said second power supply terminal through said third MOS transistor; and one of said second MOS transistors is connected in parallel to said second impedance element and each one of the remaining said second MOS transistors is connected between a common connection of a respective pair of adjacent ones of said first MOS transistors and said second power supply terminal.

6. A carry propagating device comprising a group of first MOS transistors which are controlled on a basis of an exclusive OR of a plurality of digital signals, a group of second MOS transistors which are controlled on a basis of a logic AND of said digital signals, a third MOS transistor responding to a carry signal, first and second bipolar transistors, and first, second, third and fourth impedance elements, wherein:

said bipolar transistor has a collector serving as an output terminal and is connected to a first power supply terminal, included in said device, through said first impedance element, an emitter connected to a second power supply terminal, included in said device, through said second impedance element and a base connected to a base and a collector of said second bipolar transistor;

said second bipolar transistor has the collector thereof connected to said first power supply terminal through said third impedance element and has an emitter connected to said second power supply terminal through said fourth impedance element, said first and second bipolar transistors constituting a current mirror circuit;

said first MOS transistors are connected in series to one another, the series connection of said first MOS transistors having one of two ends thereof connected to the emitter of said first bipolar transistor and having the second of said two ends thereof connected to said second power supply terminal through said third MOS transistor; and one of said second MOS transistors is connected in parallel to said second impedance element, and each one of the remaining said second MOS transistors is connected between a common connection of a respective pair of adjacent ones of said first MOS transistors and said second power supply terminal.

7. A carry propagating device comprising a group of first MOS transistors which are controlled on a basis of a logic OR of a plurality of digital signals, a group of second MOS transistors which are controlled on a basis of a logic AND of said digital signals, a third MOS transistor responding to a carry signal, a bipolar transistor, first and second impedance elements; and a reference voltage generator, wherein:

said bipolar transistor has a collector serving as an output terminal and is connected to a first power supply terminal, included in said device, through said first impedance element, an emitter connected to a second power supply terminal, included in said device, through said second impedance element, and a base to which a reference voltage is applied from said reference voltage generator;

said first MOS transistors are connected in series to one another, the series connection of said first MOS transistors having one of two ends thereof connected to the emitter of said bipolar transistor and having the second of said two ends thereof connected to said second power supply terminal through said third MOS transistor; and one of said second MOS transistors is connected in parallel to said second impedance element, and each one of the remaining said second MOS transistors is connected between a common connection of a respective pair of adjacent ones of said first MOS transistors and said second power supply terminal.

8. A carry propagating device comprising a group of first MOS transistors which are controlled on a basis of an exclusive OR of a plurality of digital signals, a group of second MOS transistors which are controlled on a basis of a logic AND of said digital signals, a third MOS transistor responding to a carry signal, first and second bipolar transistors, first and second impedance elements, and a reference voltage generator for generating first and second reference voltages, wherein:

said bipolar transistor has a collector serving as an output terminal and is connected to a first power supply terminal, included in said device, through said first impedance element, an emitter connected to a second power supply terminal, included in said device, through said second impedance element, and a base to which said first reference voltage is applied from said reference voltage generator;

said second bipolar transistor has a collector-emitter current path connected in parallel to said first impedance element, and a base to which said second reference voltage is applied from said reference voltage generator;

said first MOS transistors are connected in series to one another, the series connection of said first MOS transistors having one of two ends thereof connected to the emitter of said first bipolar transistor and having the second of said two ends thereof connected to said second power supply terminal through said third MOS transistor; and one of said second MOS transistors is connected in parallel to said second impedance element and each one of the remaining said second MOS transistors is connected between a common connection of a respective pair of adjacent ones of said first MOS transistors and said second power supply terminal.

9. A carry propagating device according to claim 8, wherein said reference voltage generator includes a series arrangement of diodes in which the forward voltage drop across two diodes thereof constitutes said first reference voltage and the forward voltage drop across three diodes thereof constitutes said second reference voltage.

10. A carry propagating device according to claim 9, wherein the series arranged diodes are comprised of a diode-connected bipolar transistor, respectively.

* * * * *